United States Patent
Hershberger

(10) Patent No.: US 6,724,832 B1
(45) Date of Patent: Apr. 20, 2004

(54) VESTIGIAL SIDEBAND GENERATOR PARTICULARLY FOR DIGITAL TELEVISION

(75) Inventor: David L. Hershberger, Nevada City, CA (US)

(73) Assignee: ADC Broadband Wireless Group, Inc.

( * ) Notice: Subject to any disclaimer, the term of this patent is extended or adjusted under 35 U.S.C. 154(b) by 0 days.

(21) Appl. No.: 09/239,668

(22) Filed: Jan. 29, 1999

(51) Int. Cl.$^7$ ............................................... H03C 1/52
(52) U.S. Cl. ........................ 375/301; 375/240; 375/295; 348/723; 348/724
(58) Field of Search ........................ 375/301, 295, 375/240; 332/170, 167; 455/109; 348/484, 470, 537, 723, 724

(56) References Cited

U.S. PATENT DOCUMENTS

| | | | | |
|---|---|---|---|---|
| 3,585,529 A | * | 6/1971 | Darlington | 332/170 |
| 3,777,064 A | * | 12/1973 | Allen et al. | 380/39 |
| 5,243,304 A | * | 9/1993 | Rixon | 332/170 |
| 5,694,419 A | * | 12/1997 | Lawrence et al. | 375/222 |
| 5,801,595 A | * | 9/1998 | Davis et al. | 332/170 |

FOREIGN PATENT DOCUMENTS

| | | |
|---|---|---|
| DE | 197 31 012 A1 | 7/1997 |
| EP | 0 508 741 A2 | 10/1992 |
| EP | 0 599 686 A1 | 6/1994 |

* cited by examiner

Primary Examiner—Shuwang Liu
(74) Attorney, Agent, or Firm—Fogg & Associates, LLC; Scott V. Lundberg

(57) ABSTRACT

A digital television transmitter for an ATSC or NTSC signal includes a digital vestigial sideband modulator having a digital sinusoidal source. A digital multiplier arrangement multiplies a digital signal including the information in the digital television signal by a sequence derived by the digital sinusoidal source to derive plural orthogonally phased digital product signals. A digital lowpass filter arrangement passes low frequency components of the plural digital product signals and rejects high frequency components of the plural digital product signals. A signal combiner arrangement combines a carrier with signals containing information passed by the lowpass filter arrangement necessary to derive a vestigial sideband signal. The combiner arrangement includes at least one digital to analog converter that in different embodiments derives a vestigial sideband signal that modulates an I.F. or R.F. carrier.

63 Claims, 12 Drawing Sheets

VESTIGIAL SIDEBAND GENERATOR PARTICULARLY FOR DIGITAL TELEVISION

TECHNICAL FIELD

The present invention relates generally to vestigial sideband generators or modulators and more particularly to a new and improved vestigial sideband generator or modulator employing modified Weaver modulator techniques and arrangements. Another aspect of the invention relates generally to digital television transmitters and more particularly to a digital television transmitter including a digital modulator including a modified Weaver modulator arrangement and technique.

BACKGROUND ART

A typical prior art digital television transmitter adapted to transmit signals containing information indicative of digitally encoded video and aural signals for deriving an ATSC A/53 standard signal is illustrated in FIG. 1 as including multi-bit digital baseband television signal source 10 which drives the cascaded combination of data randomizer 11, Reed-Solomon encoder 12, data interleaver 14, trellis encoder 16 and multiplexer 18. The signals derived from source 10, randomizer 11, encoders 12 and 16, as well as interleaver 14 and multiplexer 18 are typically three or four parallel bit signals having a symbol rate (i.e., sampling frequency) of $$\frac{1.539 \times 10^9}{143},$$

i.e., the encoded television signal is sampled 10,762,237.76 times per second. Because each symbol includes two, three or four bits, the bit rate is substantially higher than the symbol rate. The three or four parallel bits represent 8 or 16 amplitude levels of the encoded television signal.

Multiplexer 18, in addition to being responsive to the output of trellis encoder 18, responds to segment synchronizing source 20 and field synchronizing source 22 to derive an output having the same number of bits as applied to the multiplexer by encoder 16. Multiplexer 14 supplies a multi-bit output signal to pilot inserter 24 which inserts a 309.44056 KHz pilot carrier on the signal applied to it. Pilot inserter 24 derives a multi-bit output signal which it applies to pre-equalizer filter 26. Pre-equalizer filter 26 supplies a multi-bit intermediate frequency (I.F.) signal to vestigial sideband modulator or generator 28. Generator 28 feeds a multi-bit digital I.F. output signal to digital to analog converter 30, which supplies an analog I.F. signal to frequency up converter 32, a frequency synthesizer for heterodyning the I.F. output frequency of converter 30 to a radio frequency (R.F.) carrier frequency. Up converter 32 also inverts the I.F. spectrum derived from digital to analog converter 30 so the lowest frequencies in the I.F. spectrum are converted into the highest frequencies in the R.F. spectrum derived by converter 32 and the highest frequencies in the I.F. spectrum are converted to the lowest frequencies in the R.F. spectrum. The modulated carrier frequency signal derived by R.F. up converter 32 is applied to antenna 34 via power amplifier 36.

The output signal of digital to analog converter 30 includes orthogonal I and Q channels or components. At predetermined time intervals the I channel has one of multiple levels, corresponding to the number of amplitude levels in the 3 or 4 bit signal derived by signal source 10. The Q channel contains no independent information, but causes part of the unwanted lower sideband appearing at the output of up converter 32 to be reduced substantially to zero amplitude. The unwanted lower sideband is removed by circuitry included in vestigial sideband generator 28 and up converter 32 does not reintroduce it. Because up converter 32 "flips" (i.e., inverts) the I.F. spectrum derived by digital to analog converter 30, the upper sideband R.F. output of converter 30 is reduced substantially to zero.

To enable digital to analog converter 30 to produce the desired vestigial sideband signal, vestigial sideband modulator or generator 28 derives the spectrum illustrated in FIG. 2 having a 6 Mhz bandwidth and including the 309.44056 kHz pilot carrier provided by pilot inserter 24, as well as a vestigial sideband of 309.4405594 kHz, to the left of the pilot carrier frequency.

The prior art vestigial sideband modulators or generators for deriving the ATSC A/53 standard have generally used a filter or phasing method. In the filter method the vestigial sideband modulator generates a double sideband signal that is filtered to produce a vestigial sideband signal at an I.F. of about 10 MHz. Sidebands extend equally around the 10 MHz I.F. in accordance with:

$$0.5F_{sym} + F_{pilot} = 6 \text{ MHz} - F_{pilot}$$

where $F_{sym}$ is the symbol clock frequency of 10.76223776 . . . MHz of the bits derived from source 10 in accordance with the ATSC A/53 standard, and $$F_{pilot} = \frac{59}{3} \cdot FH_{NTSC} = \frac{59}{3} \cdot \frac{4.5 \text{ MHz}}{286}$$

where $FH_{NTSC}$ is the NTSC horizontal line frequency

Based on the foregoing, the sidebands of the double sideband modulator extend ±5.690559441 . . . MHz on either side, of the 10 MHz carrier. A convenient sampling frequency is four times the 10.76223776 . . . MHz symbol clock rate, i.e., 43.04895105 . . . MHz.

The ATSC A/53 standard requires the vestigial sideband generator to have a root-raised cosine (RRC) response. Obtaining a proper root-raised cosine response for vestigial sideband shaping at the 43.04895105 . . . MHz sampling rate requires a finite impulse response (FIR) filter having about 2048 filter coefficients. Implementation of such a filter is difficult.

The phasing method uses a Hilbert transform to partially cancel the unwanted sideband of a double sideband signal. The Hilbert transform can easily generate a vestigial sideband signal such that DC is 6 dB down with respect to the sidebands. This is because the response of any Hilbert transform approximation is always zero at DC. With only one of the I and Q modulators included in such a vestigial Hilbert transform sideband generator contributing at DC, the vector sum of the outputs of the two modulators drops in half at DC relative to the vector sum at a frequency where both the I and Q channels contribute to the generator output. However, in the ATSC A/53 standard, the requirement for the root-raised cosine response places the DC output at −3 dB instead of −6 dB. Therefore, the Hilbert transform method of vestigial sideband digital television modulation requires a low frequency equalizer to produce a +3 dB "shelf" at the DC and low frequency portions of the response.

To achieve the ATSC A/53 standard the vestigial sideband generator has a linear phase requirement. Consequently, equalizer filter 26 is generally implemented as a finite impulse response filter having a large number of coefficients. Further, the −3 dB requirement exists at the Nyquist frequency of the symbols, i.e., half the symbol frequency, with certain modifications. Hence, equalizer 26 must include a high frequency portion operating at a sampling frequency higher than twice the symbol rate to avoid aliasing, i.e. insertion of information at frequencies that do not exist in the sample frequency due to sampling at a frequency less than twice the highest frequency component being filtered. In this case, the highest frequency being filtered is 5.690559441 . . . MHz, which is more than half the symbol rate. Hence, the Hilbert transform method of producing a vestigial sideband signal with root-raised cosine sideband shaping is also quite difficult to implement.

Because power amplifier 34 has a non-linear amplitude response, a nonlinear equalizer must apply a substantial non-linear correction to the signal applied to it. Because of the possibility of aliasing and spectral folding through zero frequency, the amount of nonlinear correction which may be applied at 10 MHz is limited, resulting in distortion in the transmitted signal.

I have realized that the non-linear correction can be more effectively implemented to substantially reduce distortion in the transmitted signal by employing an I.F. digital signal having a frequency approximately twice the approximately 10 MHz frequency of the prior art digital I.F. The arrangement I have invented enables the digital I..F. signal to have a frequency of approximately 21.5 MHz; I have also devised an arrangement enabling the digital I.F. to be exactly 21.5 MHz.

I have realized that the problems of the prior art vestigial sideband modulators or generators employed in digital television transmitters can be resolved by using digital signal processing techniques similar to analog signal processing techniques used in Weaver single sideband analog modulators; the Weaver single sideband modulator must be modified to enable the vestigial sideband signal to be derived. The digital signal processing techniques I have developed are applicable to digital signals derived in accordance with the ATSC standard A/53, as well as digital television signals derived in accordance with the NTSC SMPTE standard.

A conventional analog Weaver single sideband modulator is illustrated in FIG. 3 as including identical balanced modulators (i.e., mixers) 30 and 32, driven in parallel by analog signal source 34, having any angular frequency $\omega_m$ in a predetermined bandwidth $\omega_1$ to $\omega_2$. Mixers 30 and 32 are driven by orthogonally phased cosine and sine analog waves derived from folding frequency oscillator 36, having an angular frequency $\omega_f$. The a frequency, $\omega_f$, of the sinusoidal waves derived by oscillator 36 is approximately equal to the arithmetical mean of the bandwidth of the signal derived from source 34, i.e., $$\frac{\omega_1 + \omega_2}{2}.$$

Mixers 30 and 32 thereby derive "folded" baseband signals, each having a bandwidth of approximately one-half the bandwidth of the signal derived from source 34.

The folded baseband signals derived by mixers 30 and 32 are respectively supplied to identical lowpass filters 38 and 40. Filters 38 and 40 have a cut-off frequency designed to (1) virtually completely attenuate (i.e., reject) the upper sidebands derived from mixers 30 and 32, and (2) pass with virtually no attenuation at least half the bandwidth of signal source 34. Filters 38 and 40 have a transition frequency range (i.e., the frequency range over which the filter response changes from substantially maximum to substantially minimum attenuation) no greater than twice the lowest frequency of source 34.

The folded baseband signals derived by lowpass filters 38 and 40 are applied to balanced modulators (i.e., mixers) 42 and 44, respectively driven by orthogonally phased cosine and sine waves at an I.F. or R.F. carrier frequency, derived by oscillator 46. Because mixers 30, 32, 42 and 44 are balanced modulators they produce the upper and lower sidebands of the waves applied to them without passing the I.F. or R.F. of oscillator 46.

The output signals of mixers 42 and 44 are linearly combined (i.e., summed or subtracted) in analog adder 48. If the signal of source 34 is represented by sin $\omega_m t$ and the angular frequencies of oscillators 36 and 46 are respectively $\omega_f$ and $\omega_c$, it can be shown that the output signal of analog adder 48 is 0.5 sin$(\omega-\omega_f+\omega_c)t$ when adder 48 sums the output signals of balanced modulators 42 and 44; if adder 48 subtracts the output signal of mixer 44 from the output signal of mixer 42, the output signal of adder 48 is 0.5 sin$(\omega_f-\omega_m+\omega_c)t$. Thus, when adder 48 sums the output signals of mixers 42 and 44, the adder output signal is the upper sideband of the combination of the frequencies derived by generator 46 and the folded baseband signals derived by filters 38 and 40; the output of adder 48 is the lower sideband when adder 48 is configured to subtract the output of mixer 44 from the output signal of mixer 42 are critical.

While the Weaver modulator theoretically derives a single sideband output signal that is a replica of the baseband signal of FIG. 3a, it has not been extensively employed for processing analog signals because of the need for lowpass filters 38 and 40 to be sharp cut off filters which are accurately matched to have the same amplitude and phase responses. In addition, all the elements of the two parallel paths must be matched and the quadrature phase relationships of $\omega_f$ and $\omega_c$ are critical.

To provide a better understanding of how the Weaver modulator of FIG. 3 functions, reference is made to the amplitude versus frequency spectra plots of FIGS. 4a–4e. In FIGS. 4a and 4b, the baseband output signal of source 34 is represented by identical spectra 52 and 54. Each of spectra 52 and 54 has a passband between $\omega_1$ and $\omega_2$ relative to DC, i.e., $\omega=0$. Spectra 52 and 54 are respectively multiplied in mixers 30 and 32 by cos $\omega_f t$ and sin $\omega_f t$ outputs of oscillator 34, respectively represented by lines 56 and 58 in FIGS. 4a and 4b to produce folded orthogonal baseband components I and Q. The positive frequencies in spectra 60 and 62 at the outputs of lowpass filters 38 and 40 are derived from the portion of spectra 52 and 54 between $\omega_f$ and $\omega_2$ while the positive frequencies in spectra 64 and 66 at the outputs of filters 38 and 40 are derived from the portion of spectra 52 and 54 between $\omega_1$ and $\omega_f$. Thus, the baseband spectra 52 and 54 are translated into spectra 60–66, centered on and symmetrical with DC i.e., $\omega=0$; spectra 60–66 extend from $$-\frac{(\omega_1 + \omega_2)}{2}$$

to $$+\frac{(\omega_1 + \omega_2)}{2},$$

thus include "negative" frequencies resulting from e multiplying action of spectra 52 and 54 with cos $\omega_f t$ and sin $\omega_f t$.

The action of oscillator 46 and mixers 42 and 44 is illustrated in FIGS. 4c and 4d. The folded baseband I and Q spectra 60–66 in the right portion of FIGS. 4*a* and 4*b* are shown on the left sides of FIGS. 4*c* and 4*d*, and multiplied in mixers 42 and 44 responsive to the cosine and sine outputs at $\omega_c$ of oscillator 46, as represented by lines 65 and 67, FIGS. 4*c* and 4*d*. The resulting outputs of mixers 42 and 44 are represented by spectra 68–74, FIGS. 4*c* and 4*d*. All of spectra 68–78 are symmetrical with carrier frequency $\omega_c$. Spectra 68 and 70 are respectively replicas of the portions of I and Q spectra 60 and 72 above $\omega_f$, while spectra 72 and 74 are respectively replicas of the portions of I and Q spectra 64 and 66 lower than $\omega_f$.

FIG. 4*e* indicates the action of adder 48 in summing the output signals of mixers 42 and 44. Folded I and Q spectra 68 and 70 are summed by adder 48, which derives single upper sideband spectrum 76; all of spectrum 76 lies above $\omega_c - \omega_f$, where $\omega_c - \omega_f$ represents the suppressed carrier. The phases of folded I and Q spectra 72 and 74 are such that there is no lower sideband (i.e., frequency inverted) energy. If adder 48 subtracts the output of mixer 44 from the output of mixer 42, the resulting single lower sideband spectrum would be the mirror image of response 76.

SUMMARY OF INVENTION

I have realized that the Weaver modulation method can produce vestigial sideband signals by selecting the folding frequency of oscillator 36 and the cutoff frequencies of filters 38 and 40 such that the "negative" frequencies of the modulating baseband signal derived from source 34 appear in the signal derived from adder 48 as a vestige of the opposite sideband, i.e., the positive frequencies of the modulating baseband signal. The folding frequency of oscillator 36 and the cutoff frequency of lowpass filters 38 and 40 are selected such that a desired amount of the opposite sideband is eliminated but a certain portion of it is passed. Hence, the Weaver modulator circuit configuration to achieve a vestigial sideband signal is the same as illustrated in FIG. 3, except for modifications of the frequency of oscillator 36 and the cutoff frequency of filters 38 and 40. Preferably, vestigial sideband modulation is produced by modifying the Weaver modulator so oscillator 36 has a reduced frequency and filters 38 and 40 have increased cutoff frequencies. Digital signal processing techniques easily establish the matched paths, which are difficult or impossible to achieve in analog processing.

While the folding frequency is preferably equal to or less than the center of the spectrum of the input signal, i.e., $$\omega_f \leq \frac{\omega_1 + \omega_2}{2},$$

(where $\omega_1$ and $\omega_2$ are respectively the lower and upper angular frequencies of the spectrum of the input signal), there are no theoretical limits to the folding frequency, except that it cannot be zero. A folding frequency of zero would not produce any sideband asymmetry. However, if the folding frequency has any non-zero value the modulator derives vestigial sideband signals with different vestigial widths. As long as the folding frequency is somewhere within the bandwidth of the input signal the intermediate I and Q channel spectra will fold.

However, if the folding frequency is higher than the highest modulating frequency, vestigial modulation will result but there will be no "folding" through zero frequency. For example, if the signal bandwidth is DC to 3 kHz, and the "folding" frequency is 4 kHz, the I and Q signals which are not actually folded extend from 1 to 7 kHz. The modulator produces a vestigial sideband signal derived in this instance by lowpass filtering the product of the wave at the "folding" frequency and the input signal somewhere between 4 and 7 kHz. There is normally no advantage to locating the folding frequency outside the bandwidth of the modulating input signal. Technical disadvantages of locating the folding frequency outside the bandwidth of the input modulating input signal include requirements for higher sampling rates and more complicated filters than occurs for folding frequencies within the bandwidth of the input modulating input signal. While the spectra will not "fold" if the folding frequency is outside the signal bandwidth the modulator could still work if higher sampling rates and more complicated filters are employed.

The spectra for a preferred embodiment of a Weaver modulator operating to produce vestigial sideband modulation are illustrated in FIGS. 5*a*–5*e*. A Weaver modulator modified to produce the spectra of FIGS. 5*a*–5*e* processes baseband spectrum 80, centered about DC, i.e., $\omega=0$, as illustrated in FIG. 5*a*. Spectrum 80 includes negative and positive frequency portions 82 and 84 which are mirror images of each other, so that negative frequency portion 82 extends from $\omega=0$ to $-\omega_3$, and the positive frequency portion 84 extends from $\omega=0$ to $+\omega_3$.

Spectra 80 of FIGS. 5*a* and 5*b* are multiplied by cosine and sine waves having a frequency $\omega_4$, which is preferably less than or equal to $$\frac{\omega_3}{2}$$

and must be more than 0. In consequence, folded baseband I channel spectra 90 and 92 are derived by multiplying the cosine wave having a frequency $\omega_4$ (indicated by line 86) by spectrum 80.

Folded baseband Q channel spectra 94 and 96 are derived by multiplying the sine wave having a frequency $\omega_4$ (indicated by line 88) by spectrum 80. I channel spectra 90 and 92 have phases that are orthogonal to Q channel spectra 94 and 96. The positive frequencies in spectra 90 and 94 respectively represent the folded baseband I and Q channels of spectrum 80 for frequencies below $\omega_4$, while the positive frequencies in spectra 92 and 96 include the portions of spectrum 80 having frequencies in excess of $\omega_4$. Spectra 90, 92, 94 and 96 are all centered about $\omega_4$, with the portions of spectra 90–96 on the left side of $\omega_4$ being mirror images of the portions of spectra 90–96 on the right side of $\omega_4$. The sum of spectra 90 and 92 and the sum of spectra 94 and 96 have zero amplitude where they intersect the $\omega$ axis at frequencies $+(\omega_3-\omega_4)$ and $-(\omega_3-\omega_4)$.

Spectra 90 and 92 are applied to a first lowpass filter to derive folded and filtered baseband I spectra 98 and 100, respectively, while spectra 94 and 96 are supplied to a second lowpass filter to derive folded and filtered baseband Q spectra 102 and 104, respectively. The first and second lowpass filters are identical, with each having a cutoff frequency, $\omega_5$, between $(\omega_3+\omega_4)$ and $(\omega_3-\omega_4)$, so that positive frequency portions of spectra 92 and 96 are essentially unchanged by the lowpass filter, but the higher positive frequency portions of spectra 90 and 94 are severely attenuated, as indicated by steep skirts 106 of spectra 102. Spectra 98–104 are symmetrical with and are mirror images about $\omega=0$.

Spectra 98 and 100 are multiplied by a cosine wave (represented by line 105, FIG. 5*c*,) at intermediate frequency $\omega_{IF}$, to derive folded and filtered I channel spectra 108 and 110. Spectra 108 and 110, centered at frequency $\omega_{IF}$, are respectively substantial replicas of spectra 98 and 100. Spectra 102 and 104 are multiplied by a sine wave (represented by line 107, FIG. 5*d*) at frequency $\omega_{IF}$ to derive folded and filtered Q-channel spectra 112 and 114, both centered at frequency $\omega_{IF}$ and having substantially the same shape as spectra 102 and 104. The phases of spectra 108 and 110 are orthogonal to those of spectra 112 and 114. Spectra 108–114 are linearly combined, i.e., added or subtracted, to produce a vestigial sideband signal.

In FIG. 5*e*, spectra 108–114 are added to produce vestigial sideband spectrum 116, including relatively steep skirt 118 that is a replica of steep skirts 106 of spectra 98 and 102. Spectrum 116 also includes (1) segment 120 which increases gradually to a peak value from the maximum amplitude of steep skirt 118, and (2) gradually decreasing portion 122 extending from the peak amplitude of spectrum 116 to zero amplitude at the w axis and which includes $\omega_{IF}$. The vestigial sideband includes all of steep skirt 118 and portion 120 of spectrum 116. In ATSC modulation, where a vestige of a replicated inverted spectrum of a discrete time digital signal appears as a tail of an upper sideband (lower sideband at I.F.) full sideband portion 122 also includes a Nyquist frequency, $\omega_N$, which is spaced from $\omega_{IF}$ by $\frac{1}{2}\omega_5 - \omega_4$, where $\omega_5$ is the sampling frequency.

A comparison of spectra 76 and 116 indicates the portion of spectra 116 that is the vestigial sideband. Vestigial sideband spectrum 116 differs from single sideband spectrum 76 because spectrum 116 contains a vestige of the opposite sideband arising from the mirror image negative frequencies 82 of spectrum 80. In this regard, steep skirt 118 is to the left of carrier frequency $\omega_{IF} - \omega_4$ in spectrum 116; carrier frequency $\omega_{IF} - \omega_4$ in spectrum 116, at the highest amplitude value in the spectrum of FIG. 5E, corresponds to $\omega_c - \omega_f$ in spectrum 76. The vestige also includes portion 120 of spectrum 116 that extends to the left of $\omega_{IF} - \omega_4$.

The high frequency end of vestigial sideband spectrum 116 also includes a spectrum tail. In a discrete time system (i.e., a sampled system), the spectrum tail arises from a small portion of the inverted replicated frequency just beyond $\omega_N$, the Nyquist frequency.

The amplitude versus frequency response spectrum diagrams of FIGS. 5*f* and 5*g* are helpful in understanding the operations described in connection with FIGS. 5*a*–5*e*. FIG. 5*f* is an illustration of a theoretical baseband input spectrum applied to a modified Weaver modulator according to the invention. The input spectrum of FIG. 5*f* has a constant, non-zero amplitude between angular frequencies $-\omega_3$ and $+W_3$, and a zero amplitude for $|\omega| > \omega_3$. The modified Weaver modulator converts the baseband input of FIG. 5*f* into the vestigial sideband spectrum of FIG. 5*g*, having a carrier frequency of $\omega_c$; $\omega_c$ is either an R.F. or I.F. carrier. The spectrum of FIG. 5*g* has a constant, non-zero amplitude between frequencies $(\omega_c - \omega_1)$ and $(\omega_c + \omega_3)$. At $\omega_c + \omega_3$, the vestigial sideband spectrum of FIG. 5*g* has a step drop from the constant, non-zero amplitude to a zero value. The vestigial sideband spectrum has a frequency transition range from $(\omega_c - \omega_1)$ to $(\omega_2 - \omega_2)$ between the constant, non-zero and zero amplitude levels. The angular frequencies $-\omega_1$ and $-\omega_2$ in the baseband input of FIG. 5*f* are in the "negative" frequency portion of the baseband input, such that the absolute value of $\omega_1$ is less than the absolute value of $\omega_2$.

To achieve the vestigial sideband spectrum of FIG. 5*g*, the lowpass filters of the modified Weaver modulator must completely reject all angular frequencies in excess of the sum of the folding frequency $(\omega_f)$ and $\omega_2$ and the folding frequency must exceed $$\frac{\omega_3 - \omega_2}{2}.$$

The lowpass filters must pass, without attenuation, the greater of $|\omega_3 - \omega_F|$ and $|\omega_F + \omega_1|$. The lowpass filters must have a response of the type generally indicated by the amplitude versus frequency response curve of FIG. 5*h*. Each of the lowpass filters has a substantially zero attenuation between DC, where $\omega = 0$, and the greater of $|\omega_3 - \omega_f|$ and $|\omega_f + \omega_1|$. Each of the lowpass filters completely rejects all frequencies greater than $(\omega_f - \omega_2)$ In the case of an 8 or 16 level ATSC digital television signal, filtering of the vestigial sideband signal is symmetrical. Therefore, the shape of the vestigial lower sideband is the same as the shape of the inverted replicated spectrum appearing around the Nyquist rate.

The action of the modified Weaver modulator in combining the positive and negative frequencies of spectrum 80 and the positive and negative replicated frequencies resulting from the multiplying action of the sine and cosine waves at folding frequency $\omega_4$ is illustrated in FIG. 6 which represents the digital signal derived from multiplier 18 at baseband. In FIG. 6, block 124, indicates the positive frequencies of spectrum 80, extending between 0 and $\omega_m$, while block 126 indicates the positive replicated frequencies having an inverted spectrum between frequencies $\omega_m$ and $2\omega_m$. Block 128, extending between $\omega = 0$ and $\omega = -_m$, indicates the negative frequencies with an inverted spectrum 82 of spectrum 80. The negative replicated frequencies of spectrum 82, between frequencies $-_m$ and $-2\omega_m$, are indicated by block 130.

It is, accordingly, an object of the present invention to provide a new and improved method of and apparatus for generating a vestigial sideband signal, particularly a digital vestigial sideband I.F. signal.

Another object of the invention is to provide a new and improved method of and apparatus for using the Weaver modulation technique for deriving a vestigial sideband signal.

A further object of the invention is to provide a new and improved digital television transmitter apparatus and method.

An added object of the invention is to provide a digital television transmitter for deriving a vestigial sideband signal directly, without filtering a double sideband signal and without using a Hilbert transform.

An additional object of the present invention is to provide a new and improved digital television transmitter including a vestigial sideband generator including a finite impulse response filter having a relatively low number of filter coefficients, while still obtaining a favorable root-raised cosine response.

Yet another object of the invention is to provide a new and improved easily implemented digital television transmitter for deriving a vestigial sideband signal having a favorable root-raised cosine response which does not require a low frequency or high frequency equalizer.

A still further object of the invention is to provide a television transmitter wherein the same digital vestigial sideband arrangement can be used to produce NTSC and ATSC signals.

Still another object of the invention is to provide an ATSC television transmitter for deriving a digital vestigial I.F. signal having a sampling frequency at least twice as high as prior art transmitters and finite impulse response filters having a relatively low number of filter coefficients, while still obtaining a favorable root-raised cosine response.

In accordance with one aspect of the present invention a first signal having a frequency $\omega_m$ in a predetermined bandwidth extending from $\omega_1$ to $\omega_2$ is converted to a vestigial sideband signal by multiplying the first signal by orthogonally phased sinusoidal components having a frequency $\omega_4$ to derive orthogonal second and third signals each having a frequency equal to $(\omega_m-\omega_4)$ and containing the information in the first signal. The second and third signals are lowpass filtered to derive fourth and fifth orthogonal signals each having the same frequency and containing the information in the first signal. The frequencies $\omega_1$, $\omega_2$ and $\omega_4$ are such that a vestigial sideband signal modulating the carrier and containing the information in the first signal is derived when (1) the fourth and fifth signals are multiplied with quadrature phases of a carrier and (2) the resulting product signals are linearly combined. Signals that substantially replicate the information in the fourth and fifth signals and a carrier are combined to derive the vestigial sideband signal containing the information in the first signal.

In a preferred embodiment, $\omega_4$ is a folding frequency greater than zero and less than or equal to $$\frac{\omega_1 + \omega_2}{2}.$$

The fourth and fifth signals (1) have a spectrum extending between $\omega_1$ and $\omega_3$, and (2) are such that the frequency components of the first signal extending between $\omega_1$ and $\omega_4$ are folded on the frequency components of the first signal extending between $\omega_4$ and $\omega_2$. Signals that substantially replicate the information in the fourth and fifth signals are combined to derive the vestigial sideband signal.

In the preferred embodiments, $\omega_4$ is a folding frequency no greater than $$\frac{\omega_2}{2}$$

and the first signal is a baseband signal such that $\omega_1=0$. The low pass filtering step passes without substantial attenuation signals having frequencies from DC to $\omega_5$ and substantially rejects frequencies greater than $\omega_6$, where $\omega_5$ is $$> \frac{\omega_2}{2}$$

and $\omega_6$ is $<\omega_2$. The combining step is such that negative frequencies of the first signal appear in the vestigial sideband signal as a vestige of the sideband of the vestigial sideband signal containing the positive frequencies of the first signal.

The first, second, third, fourth and fifth signals are preferably digital signals having a first fixed sampling frequency. Circuitry responsive to the fourth and fifth signals converts the digital information in the fourth and fifth signals into an analog vestigial sideband signal modulating an R.F. carrier. In one embodiment the fourth and fifth digital signals are converted directly into analog signals that are separately mixed with orthogonal phases of an R.F. carrier and the resulting product signals are linearly combined.

In other, more preferred embodiments, the sampling frequency of the fourth and fifth signals is increased to a second fixed sampling frequency. In some preferred embodiments the signals having the second fixed sampling frequency are mixed with orthogonal phases of a digital I.F. carrier to derive first and second digital product signals that are linearly combined to derive a digital vestigial I.F. In another embodiment, the digital signals at the second sampling frequency are combined with several orthogonal phases of a digital I.F. carrier to derive a pair of orthogonal I.F. digital signals that are converted into analog signals which are, in turn, separately mixed with orthogonal phases of an R.F. carrier. The resulting R.F. modulated waves are linearly combined to derive an R.F. vestigial sideband signal.

In some embodiments the sampling frequency of the fourth and fifth digital signals is offset to a frequency having a round number value. In one embodiment offsetting is achieved by arranging the first signal so it has a sampling frequency that is a fraction of a fixed sampling frequency of an input signal containing the information in the first signal. In such a case, offsetting is achieved by increasing the sampling frequency of the input signal to derive the first signal and low pass filtering the first signal to derive the signal multiplied by the components having the frequency $\omega_4$. In another embodiment, offsetting is achieved with circuitry including a low frequency digital source deriving signals representing a pair of orthogonal sinusoidal waves. Digital circuitry including multiple multipliers and adders responds to the low pass filtered signals and the signals representing the orthogonal sinusoidal waves to derive signals that are applied to circuits for increasing the sampling frequency.

In a preferred embodiment, the first signal is an ATSC or NTSC digital television signal and the vestigial sideband signal results from at least one digital signal that contains the information necessary to derive the vestigial sideband transmitted signal. In a preferred embodiment the digital signal is an I.F. that is converted to an analog I.F. signal. The I.F. is up frequency converted to derive an I.F. output signal having a spectrum inverted relative to the I.F. signal.

Preferably, for the ATSC signal, each cycle of each of the orthogonally sinusoidal phased components that are multiplied with the input signal is represented by four digital values. In one embodiment, each of the multiplying operations is performed such that a first of the digital values passes bits of each of the multiplied signals in unaltered form and a second of the digital values inverts the polarity of each of the signals. In a second embodiment, each of the multiplying operations is performed such that a first of the digital values passes bits of each of the multiplied signals in unaltered form, a second of the digital inverts the polarity of bits of each of the signals and a third of the digital values blocks bits of each of the multiplied signals.

When the digital television signal is an NTSC signal the frequency modulated aural carrier may be added by adding quadrature FM components at the proper frequency to the folded baseband signals.

Another aspect of the invention relates to a digital television transmitter responsive to a digital television signal. The transmitter includes a digital vestigial sideband modulator including a digital sinusoidal source for deriving a digital signal representing a sinusoidal wave. A digital multiplier multiplies a digital signal including the information in the digital television signal by the digital signal representing the sinusoidal wave: to derive plural digital product signals. A digital lowpass filter arrangement passes low frequency components of the plural digital product signals and blocks high frequency components of the plural digital product signals. Circuitry responsive to a carrier and the signals passed by the low pass filter arrangement derives an analog vestigial sideband signal including the information in the digital television signal.

In one preferred embodiment, the circuitry includes a digital linear combiner for deriving a digital vestigial sideband I.F. signal having a frequency of about 20 mHz. A digital to analog converter arrangement converts the digital vestigial sideband I.F. signal into an analog intermediate frequency signal. An up converter increases the frequency of the intermediate frequency to a desired transmission frequency or channel.

The above and still further objects, features and advantages of the present invention will become apparent upon consideration of the following detailed descriptions of several specific embodiments thereof, especially when taken in conjunction with the accompanying drawings.

BRIEF DESCRIPTION OF DRAWINGS

As previously described.

As previously described.

As previously described.

As previously described.

As previously described.

As previously described.

DESCRIPTION OF THE PREFERRED EMBODIMENTS

Figure 7:
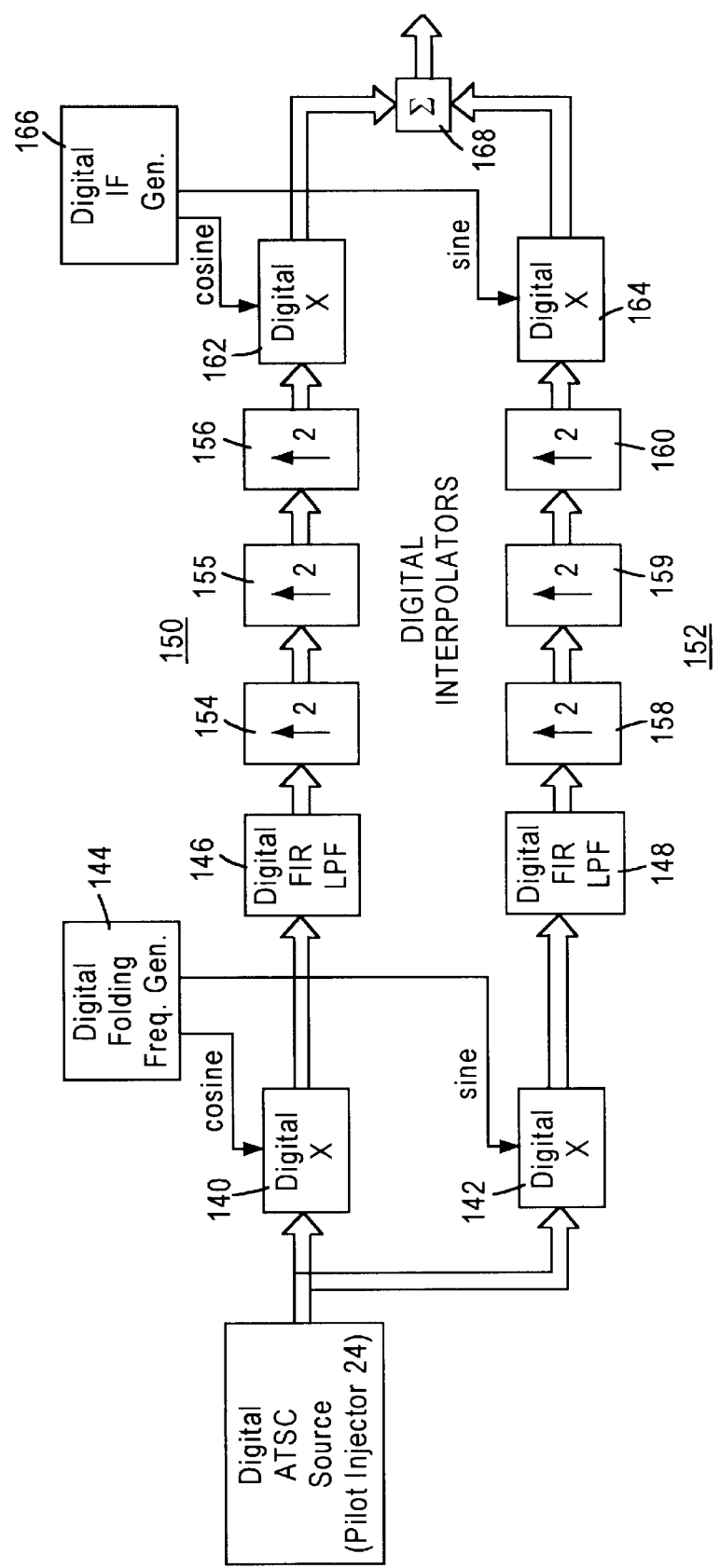
FIG. 7 is a block diagram of a modified Weaver modulator for deriving a vestigial sideband digital I.F. ATSC/A53 signal, in accordance with one embodiment of the present invention.

Reference is now made to FIG. 7 of the drawing, a block diagram of a modified Weaver modulator for deriving a vestigial sideband digital I.F. signal. A multi-bit parallel digital input signal having 12 bits and a sampling frequency of 10.76223776 . . . MHz, as derived from pilot inserter 24 and pre-equalizer filter 26, in the form of an ATSC/A53 television standard, is applied in parallel to identical simple digital multipliers 140 and 142.

Multipliers 140 and 142 are responsive to orthogonal digital representations of cosine and sine waves each having a 10.76223776 . . . MHz bit frequency, as derived from folding frequency generator 144. Generator 144 can be considered as deriving cosine and sine waves having frequency $\omega_4$ (FIG. 5), whereby multipliers 140 and 142 derive spectra 90–96.

Generator 144 generates each cycle of the cosine sequence supplied to multiplier 140 as the digital, tri-level sequence 1,0,–1,0, or the bi-level digital sequence 1,1,–1,–1. Thus, the frequency of each cycle of the cosine sequence supplied by generator 144 to multiplier 140 is 2.690559441 . . . MHz. The sine sequence supplied by generator 144 to multiplier 142 is displaced by one bit, i.e., 90°, from the cosine sequence so the sine sequence associated with the tri-level cosine sequence is 0,1,0,–1, while the sine sequence associated with the bi-level cosine sequence is –1,1,1,–1. For clarity, the levels derived by generator 144 are simultaneously supplied to multipliers 140 and 142 in the illustrated embodiment of the invention. It is to be understood, however, that the cosine and sine sequences can be interleaved, in which case, only a single multiplier is necessary; in such a case the inputs and outputs of multipliers 140 and 142 are delayed from each other by one-half the period of the 10.76223776 . . . MHz symbol rate.

Because the sequences derived by generator 144 are 1,0,–1,0 and 0,1,0,–1 or 1,1,–1,–1 and –1,1,1,–1, multipliers 140 and 142 are trivial elements. Multipliers 140 and 142 respond to the zero values in the sequences to block passage of the symbols applied to them. Multipliers 140 and 142 respond to the 1 and –1 values derived by folding frequency generator 144 to pass the symbol applied to them in an unaltered manner when the cosine and sine waves have values of 1; the multipliers invert the values of the symbols when the cosine and sine values have values of –1. The sequences without zeroes derived by generator 144, i.e., sequences 1,1,–1,–1 and –1,1,1,–1, produce higher amplitude signals than are produced by the sequences having zeroes. Consequently, the sequences without zeroes produce signals having lower quantizing noise than the sequences with zeroes.

Figure 5A:
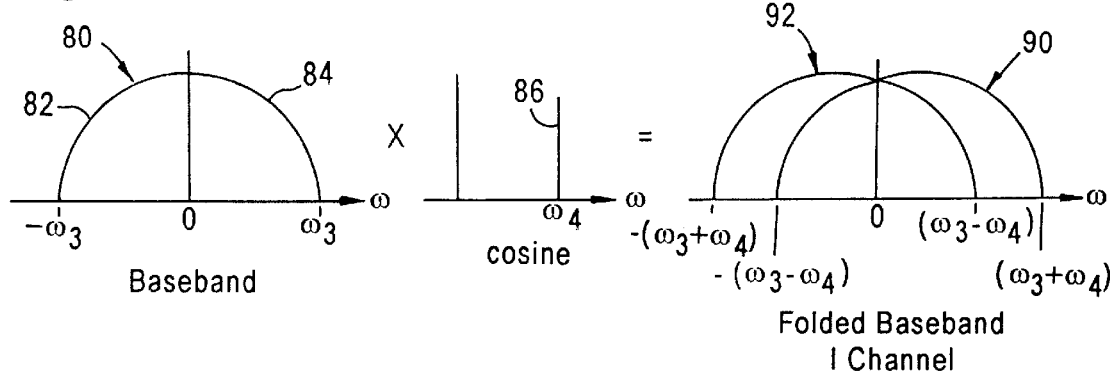
FIGS. 5a–5e are spectra derived by a Weaver modulator modified in accordance with the present invention to derive a vestigial sideband signal.
Figure 5B:
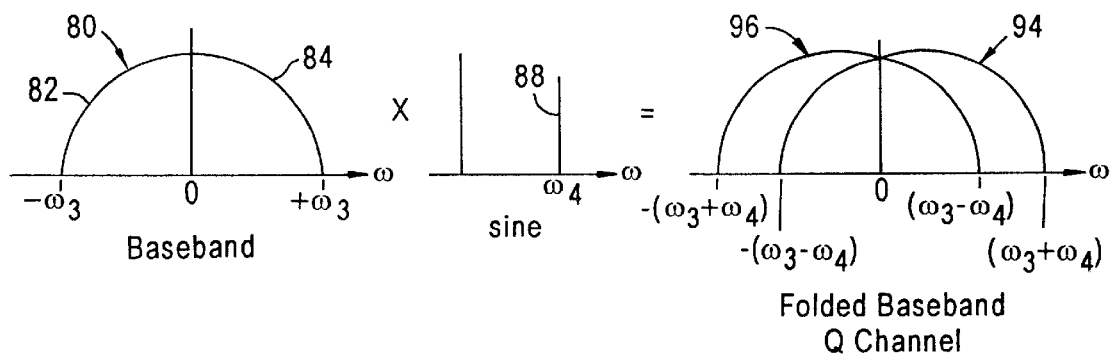
Figure 5C:
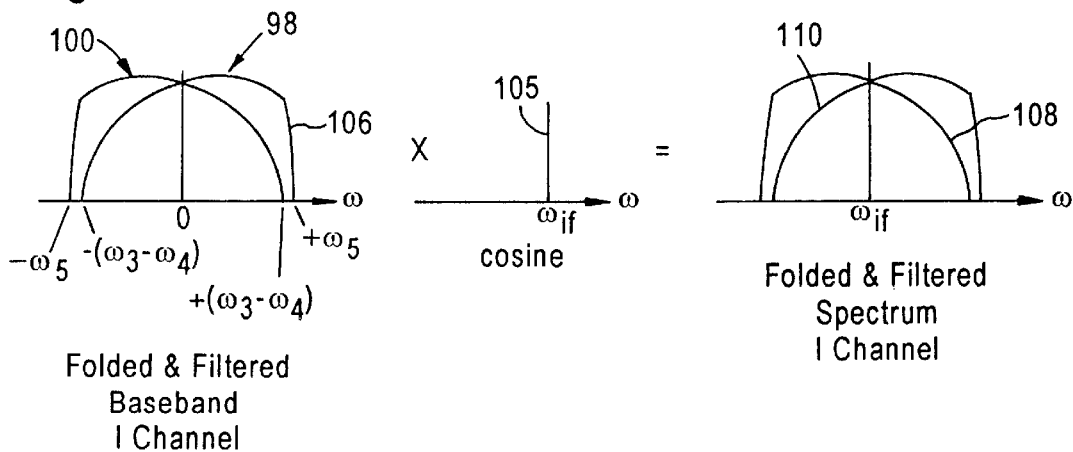
Figure 5D:
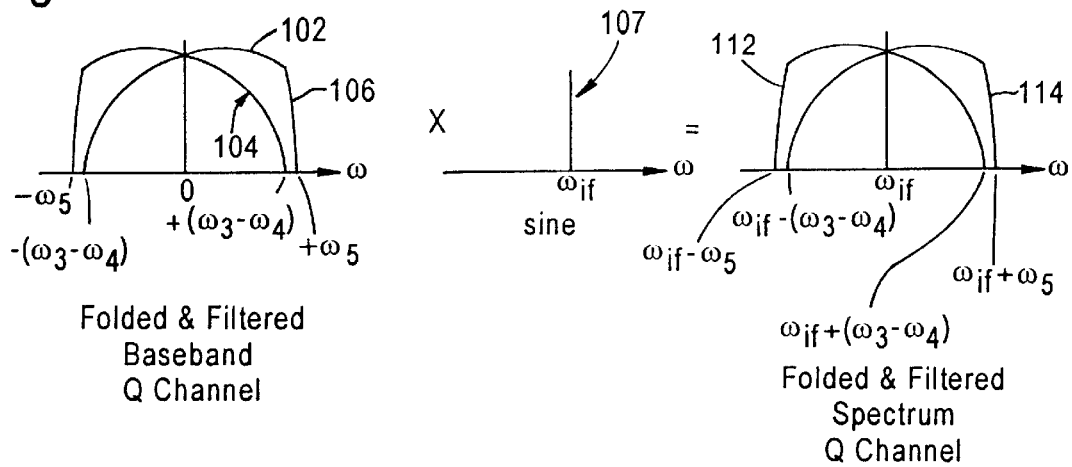
Figure 5E:
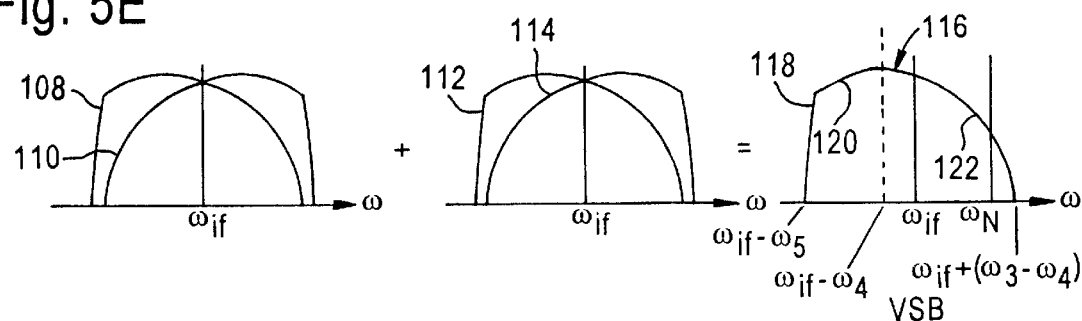
Figure 5F:
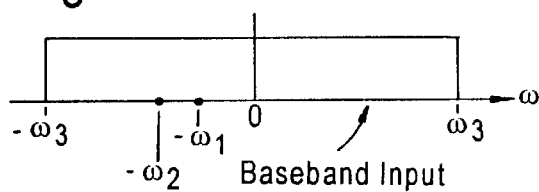
FIGS. 5f, 5g and 5h are amplitude versus frequency response curves helpful in describing the operation of the Weaver modulator modified in accordance with the present invention.
Figure 5G:
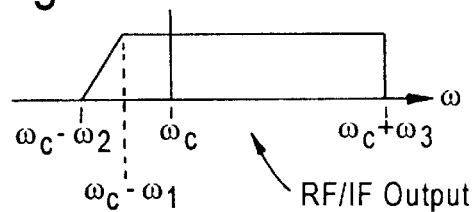
Figure 5H:
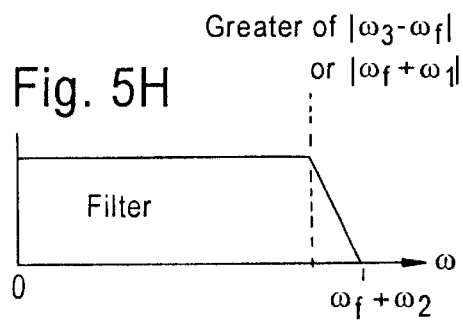

The product signals derived by multipliers 140 and 142 are respectively applied to identical finite impulse response (FIR) digital lowpass filters 146 and 148. Each of filters 146 and 148 can be implemented with approximately 256 finite impulse response coefficients, selected to produce the root-raised cosine response and spectra 98–104 (FIGS. 5c and 5d). Hence, filters 146 and 148 pass, without substantial attenuation, the frequency of the sine and cosine representing waves derived by generator 144 and block virtually all components at the high frequency end of the digital television signal supplied to multipliers 140 and 142. In contrast the prior art bandpass filter requires about 2048 finite impulse response coefficients. Filters 146 and 148 can be replaced by a single filter that is multiplexed to respond to the two product signals derived by multipliers 140 and 142.

The lowpass filtered sequences digital filters 146 and 148 derive are respectively applied to interpolator sets 150 and 152 for multiplying by eight the sampling rate of filters 146 and 148, respectively. To this end, interpolator set 150 includes three cascaded times two up sampling interpolators 154–156, while interpolator set 152 includes three cascaded times two up sampling interpolators 158–160. Consequently, the sampling frequency of the output signals of each of interpolators 156 and 160 is 86.0979021 . . . MHz.

The output signals of interpolators 156 and 160 are respectively supplied to identical digital multipliers 162 and 164, preferably constructed the same as multipliers 140 and 142. Multipliers 162 and 164 are respectively responsive to cosine and sine sequences, each cycle of which has the same values as the cosine and sine sequences derived from folding frequency generator 144; each cycle of the sine and cosine sequences supplied to multipliers 162 and 164 is at the I.F. of 21.52447552 . . . MHz. Because there are four digital values in each cycle of the cosine and sine representing sequences derived by generator 166, the symbol frequencies derived by the generator equal the symbol frequencies derived by interpolators 156 and 160.

Multipliers 162 and 164 derive binary signals such that the output signal of multiplier 162 is represented by spectra 108 and 110, FIG. 5c, while the output signal of multiplier 164 is represented by spectra 112 and 114, FIG. 5d. The digital output signals of multipliers 162 and 164 are linearly combined, i.e., summed, in digital adder 168 to produce a digital vestigial sideband I.F. signal having a bandwidth between approximately 18.5 and 24.5 MHz centered at 21.52447552 . . . MHz, as indicated by spectrum 116, FIG. 5e.

The output signal of adder 168 is applied to digital to analog converter 30 (FIG. 1), which derives an analog I.F. vestigial sideband signal including I and Q channels such that the I channel, at predetermined times, contains one of either 8 or 16 levels. The eight or 16 levels are commensurate with the binary value of the signal derived from multiplexer 18 at a time corresponding to each predetermined time. The digital to analog converter Q channel causes part of the unwanted vestigial sideband derived by modulator or generator 28 to be reduced to zero to enable spectrum 80, FIG. 5a, to occupy less bandwidth than would otherwise be the case.

The modified Weaver arrangement of FIG. 7 for generating ATSC A/53 standard, digital I.F. signals results in aliasing and replicated spectra which must be considered. Because the ATSC signal derived from multiplexer 18 has a symbol rate of 10.76223776 . . . MHz, energy is produced at the Nyquist frequency of 5.381118881 . . . MHz. The modulated analog I.F. signal derived by analog to digital converter 30 and the R.F. modulated analog signal derived by up converter 32 and power amplifier 36 at the carrier frequency contain a vestige of the opposite sideband arising from the mirror-image negative frequencies indicated by boxes 128 and 130. The signals derived by digital to analog converter 30, R.F. up converter 32 and power amplifier 36 also contain the spectrum tail at the high frequency end of the spectrum, arising from the small portion of the inverted replicated spectrum indicated in FIG. 5e, to the right of the Nyquist frequency $\omega_N$ in portion 122 of spectrum 116.

Frequently it is desirable for the symbol rate derived by adder 168 and applied to digital to analog converter 30 to have a precise round or decimal frequency, such as 21.5 MHz, rather than the 21.52447552 . . . MHz signal derived by adder 168. To this end, in accordance with another aspect of the invention, the circuitry of FIG. 7 is modified, as illustrated in FIG. 8, to enable a 21.5 MHz digital vestigial sideband signal to be derived without using general purpose digital multipliers at the frequency of the signals derived by interpolators 156 and 160.

Figure 8:
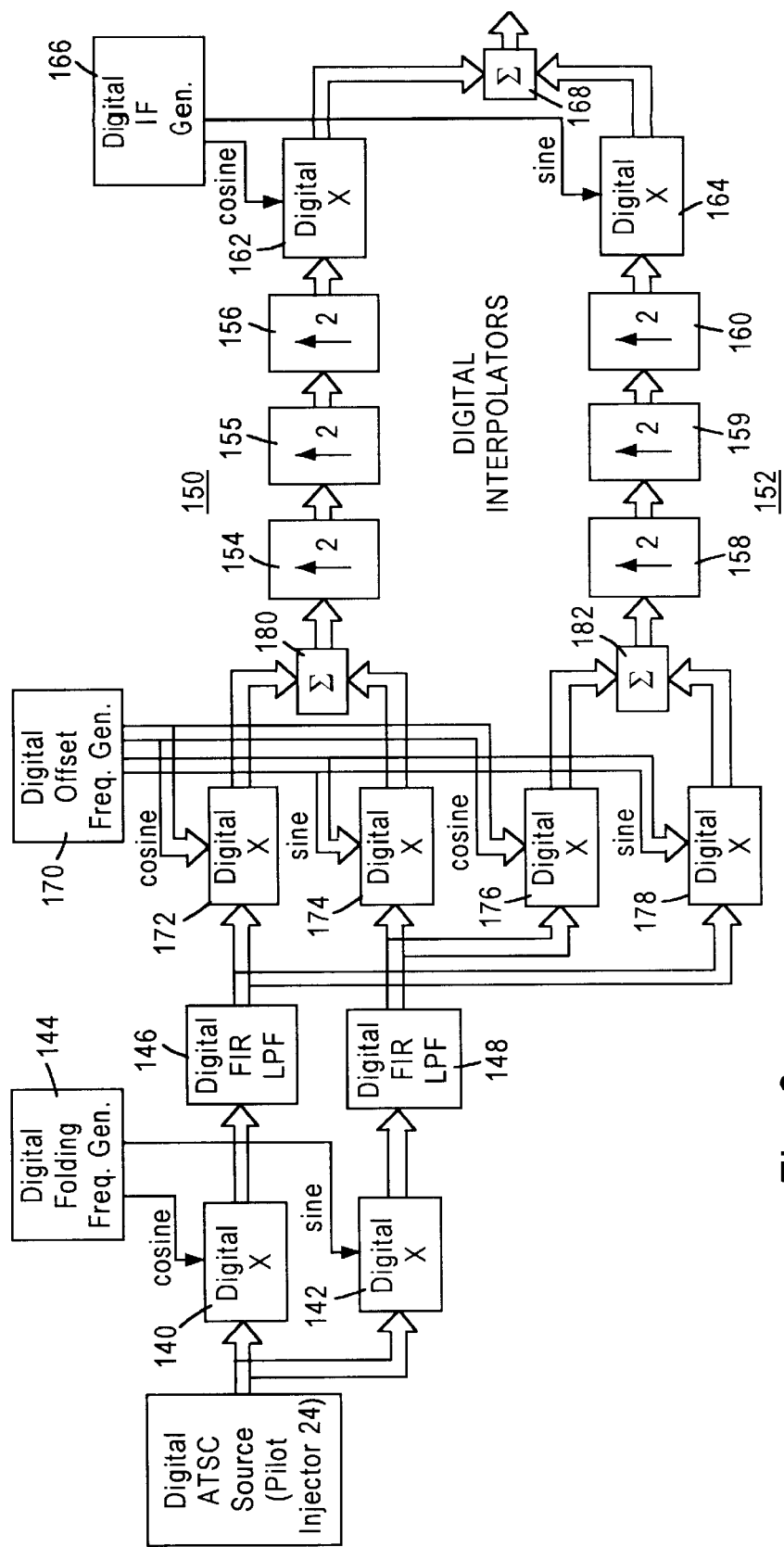
FIG. 8 is a block diagram of a modified Weaver modulator for deriving a vestigial sideband ATSC/A53 I.F. signal having a frequency with a round number, in accordance with a second embodiment of the present invention.

The modified digital Weaver modulator of FIG. 8 includes all the elements of the modified Weaver modulator illustrated in FIG. 7, as well as digital frequency synthesizer 170 (which functions as an offset frequency generator), general purpose digital multipliers 172, 174, 176 and 178, and digital adders, (i.e., linear combiners) 180 and 182 for respectively adding and subtracting the input signals supplied to them. Adders 180 and 182 respectively drive interpolators 154 and 158. Multipliers 172 and 178 are driven in parallel by the output signal of lowpass filter 146 while multipliers 174 and 176 are driven in parallel by the output signal of lowpass filter 148. Offset frequency generator 170 derives orthogonal sequences, each cycle of which has digital values that are the same as each cycle of the sequences derived by folding frequency generator 144.

The cos $\omega_0 t$ output of offset frequency generator 170 is applied in parallel to multipliers 172 and 176, while the sin $\omega_0 t$ output of the offset frequency generator is applied in parallel to multipliers 174 and 178. To enable the signal derived by adder, 168 to be at an integer value such as 21.5 MHz, the frequency of generator 170 is set to a value equal to the difference between one fourth of the bit frequency at combiner 168 and the desired carrier frequency of the I.F. output signal; in the specific example, the frequency of offset generator 170 is 24.4755244. . . KHz.

The digital vestigial sideband modulator or generator of FIG. 8 functions such that the digital output signals of lowpass filters 146 and 148 are respectively represented by 0.5 $\sin(\omega_m-\omega_4)t$ and 0.5 $\cos(\omega_m-\omega_4)t$. The signals derived by multipliers 172, 174, 176 and 178 are respectively represented by:

$$0.5 \cos(\omega_m-\omega_4)t * \cos \omega_o t$$

$$0.5 \sin(\omega_m-\omega_4)t * \sin \omega_o t$$

$$0.5 \sin(\omega_m-\omega_4)t * \cos \omega_o t$$

$$0.5 \cos(\omega_m-\omega_4)t * \sin \omega_o t$$

where $\omega_m$ is the frequency of the television signal derived by pilot inserter 24, $\omega_4$ is defined supra as the frequency of generator 144, and $\omega_0$ is the frequency derived by offset generator 170.

Adder 180 sums the output signals of multipliers 172 and 174 to derive a signal which can be shown, by trigonometric manipulation, to equal $$0.5 \sin(\omega_m-\omega_4+\omega_0)t.$$

Thus, the output signal of adder 180 is frequency shifted upwardly from the output of lowpass filter 146 by $\omega_0$, the offset frequency of generator 170. Adder 182 subtracts the output signal of multiplier 178 from the output signal of multiplier 176 to derive a signal which can be shown by trigonometric manipulation, to equal $$0.5 \cos(\omega_m \omega_4+\omega_0)t.$$

Thus, the output signal of subtracting adder 182 is offset in frequency upwardly from the output signal of lowpass filter 148 by $\omega_0$. The output signals of linear combiners 180 and 182 thus have the same frequency but are phase displaced from each other by 90°. Proper manipulation of the polarities at the inputs of adders 180 and 182 or at frequency generator 170 can reverse the direction of the frequency offset.

It is desirable for the output frequencies of linear combiners 180 and 182 to be a precise numerical value to simplify the frequency synthesizer included in up converter 32 which shifts the I.F. derived by digital to analog converter 30 to the carrier frequency derived by power amplifier 36, without affecting the modulation on the carrier derived by digital to analog converter 30. The up converter is simplified because digital television signals derived in accordance with the ATSC standard can be offset from the carrier frequency by several predetermined frequencies for various reasons, such as the possibility of interference between signals emitted from antennae that might be spaced from each other by 200 or more kilometers but which are at nominally the same frequency, i.e., have the same television channel number. These "channel offsets" can be programmed into the offsetter of FIG. 8.

Because multipliers 172–178 respond to the output signals of lowpass filters 146 and 148 which are at the symbol frequency of 10.76223776 MHz, multipliers 172–178, which perform simple functions such as passing, blocking or inverting the values supplied to them, can be replaced by a single multiplier that is time multiplexed.

The modulator of FIG. 8 enables the digital I.F. center frequency to be offset so it has a round number without using high speed general purpose digital multipliers at the high frequency sampling rate of eight times the symbol frequency. Digital multiplication is performed at the high frequency by using simple digital multipliers 162 and 164. While multipliers 172–178 are of the general purpose type, these multipliers operate at relatively low frequencies in response to the low sampling frequencies derived by filters 146 and 148 and the low frequency outputs of synthesizer 170.

Figure 9:
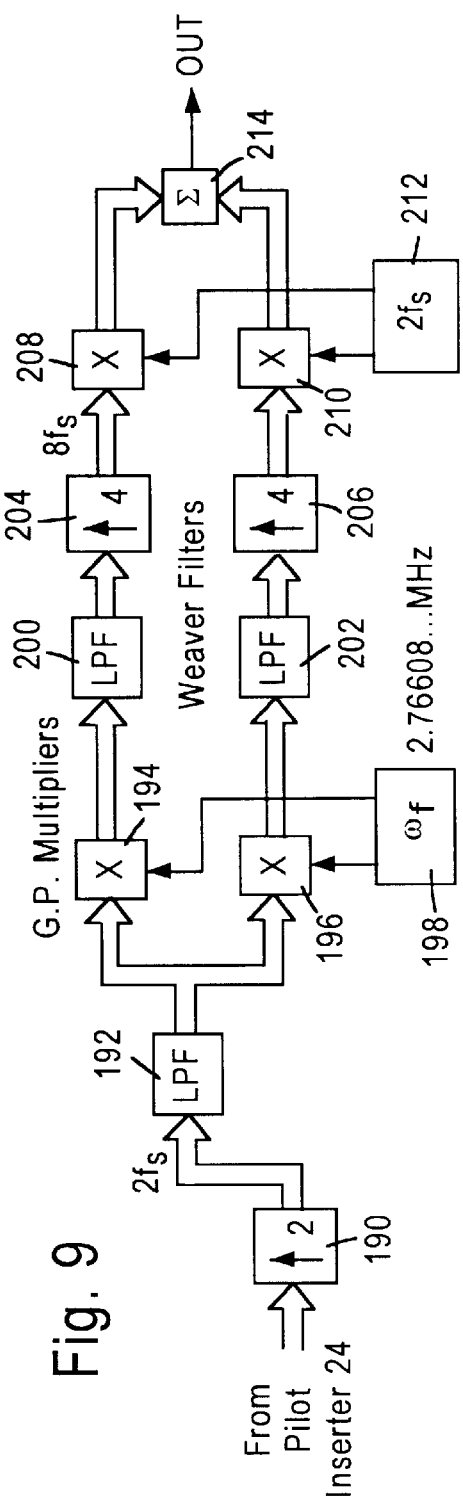
FIG. 9 is a block diagram of a further embodiment of a vestigial sideband modulator for a digital television transmitter, wherein the digital signal is applied to a lowpass filter prior to being applied in parallel to a pair of orthogonal parallel modified Weaver modulator processing channels.

FIG. 9 is a diagram of a further embodiment of digital circuitry for deriving a vestigial sideband digital I.F. signal having a sampling frequency centered at a desired "round number;" in particular, the I.F. is centered at 21.6 MHz. The circuit of FIG. 9 does not require the frequency shifting circuitry of FIG. 8 to enable a desired "round number" I.F. center frequency to be derived.

In the circuit of FIG. 9, the output signal of pilot inserter 24 is applied to interpolator 190 which increases the sampling frequency of the digital television ATSC signal derived by pilot inserter 24 by a factor of 2 from 10.76223776 . . . MHz to 21.52447552 . . . MHz. The digital output signal of interpolator 190 is applied to digital lowpass filter 192 having a root-raised cosine response. Filter 192 passes, without substantial attenuation, all information in the digital signal derived by interpolator 190 for frequencies up to 5.07 . . . MHz and substantially rejects all information in the output signal of interpolator 190 for frequencies above 5.69 . . . MHz.

The digital output signal of lowpass filter 192 is applied in parallel to general purpose digital multipliers 194 and 196, having second inputs responsive to orthogonally phased cosine and sine representing digital signals having a frequency ($\omega_f$) of 2.766008 . . . MHz, as derived from frequency synthesizer 198. Multipliers 194, 196 and synthesizer 198 are respectively constructed the same as multipliers 172–178 and synthesizer 170, FIG. 8. The resulting digital product signals derived by multipliers 194 and 196 are respectively applied to finite impulse response digital lowpass filters 200 and 202 which are similar to filters 146 and 148 and produce a root-raised cosine response. Filters 200 and 202 differ from filters 146 and 148 because the former operate at twice the frequency of the latter. Filters 200 and 202 thus pass, without substantial attenuation, the frequency of the sine and cosine representing waves derived by generator 198 and block virtually all components at the high frequency end of the digital television signal supplied to multipliers 194 and 196.

The digital output signals of lowpass filters 200 and 202 are respectively supplied to interpolators 204 and 206 which multiply by a factor of four the sampling frequencies of the digital signals derived by filters 200 and 202. The digital output signals of interpolators 204 and 206, having a sampling frequency eight times the sampling frequency of the signal derived by pilot inserter 24, are respectively applied to simple multipliers 208 and 210, driven by orthogonal cosine and sine sequences derived by digital I.F. generator 212. The cosine and sine sequences derived by digital I.F. generator 212 have the same values in each cycle as the sequences derived by generators 144 and 166, FIG. 7. The sequences derived by digital I.F. generator 212 have the same sampling frequency, equal to twice the sampling frequency of the digital signal applied to lowpass filter 190, i.e., 21.52447552 . . . MHz.

Figure 1:
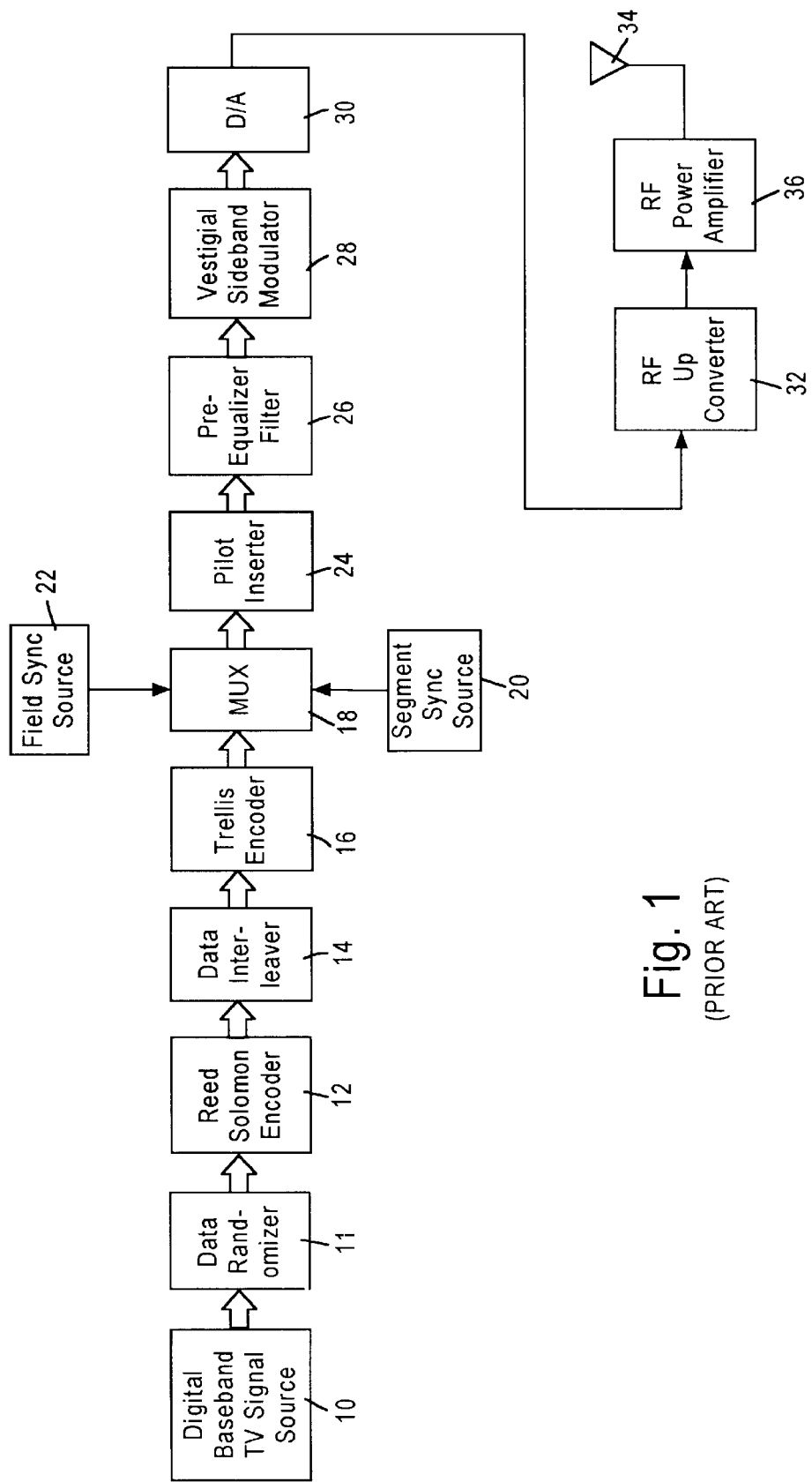
FIG. 1 is a block diagram of a prior art digital television transmitter.
Figure 6:
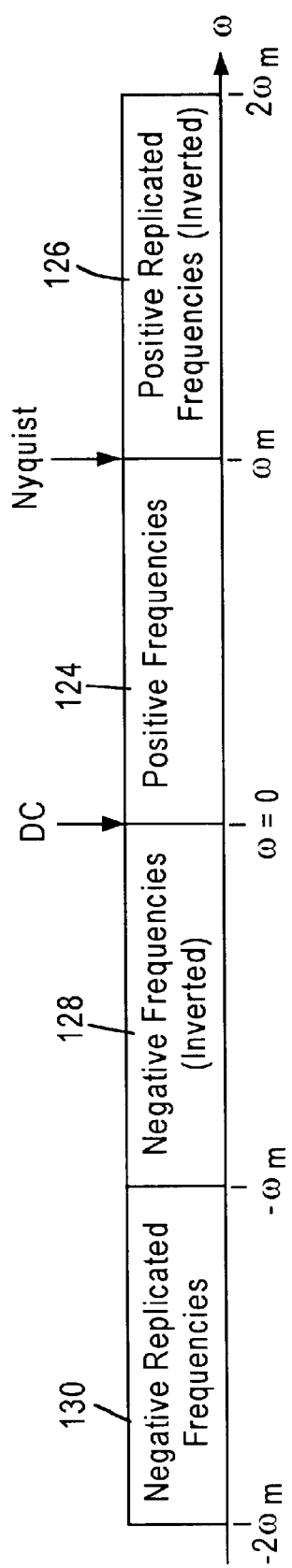
FIG. 6 is a diagram of the spectrum derived as a result of the operations illustrated in FIGS. 5a–5e.
Figure 2:
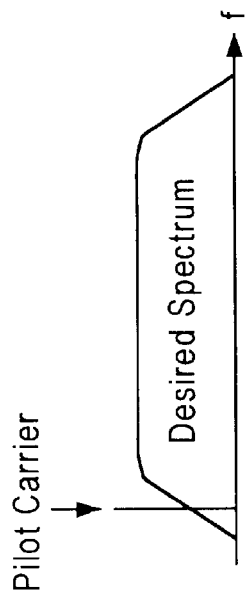
FIG. 2 is a diagram of the spectrum desired to be derived by the transmitter of FIG.
Figure 3:
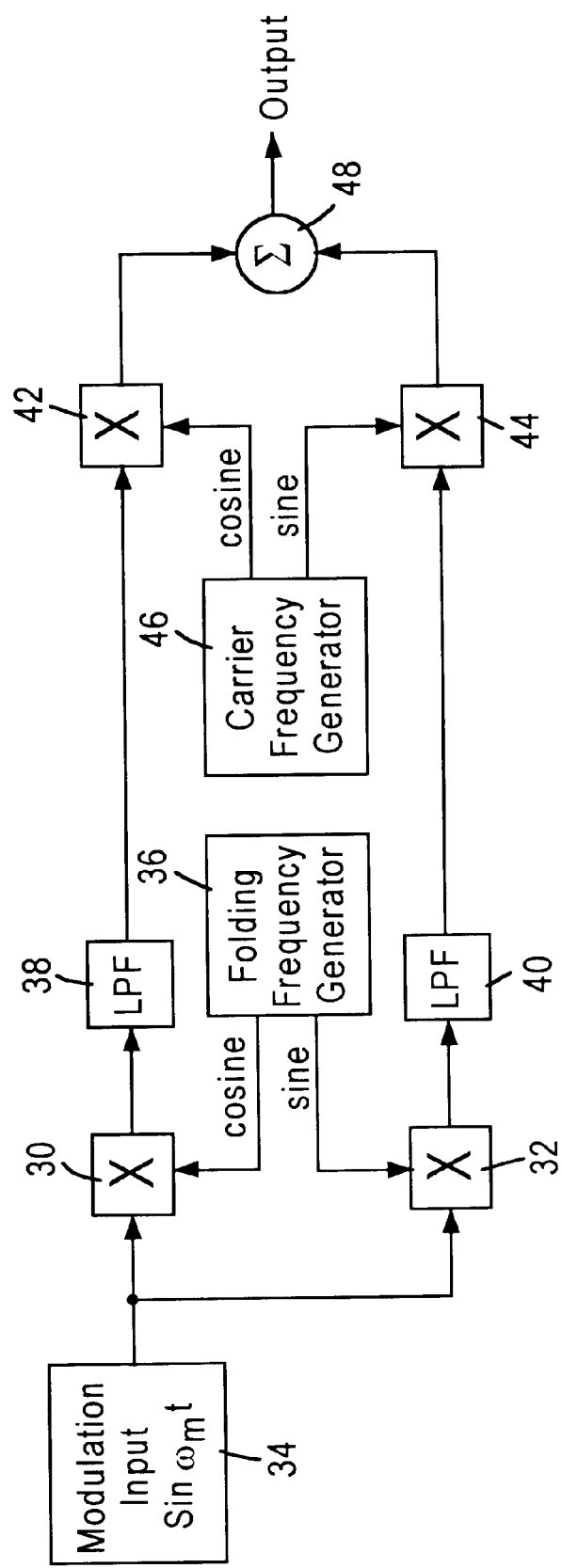
FIG. 3 is a circuit diagram of a prior art Weaver modulator.
Figure 4A:
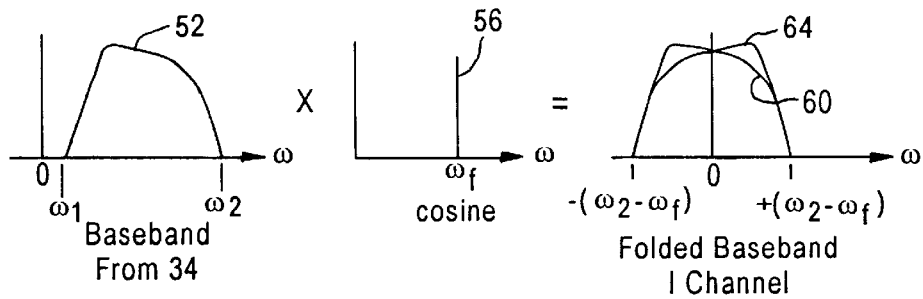
FIGS. 4a–4e are spectra derived by the Weaver modulator of FIG. 3 when operated according to the prior art.
Figure 4B:
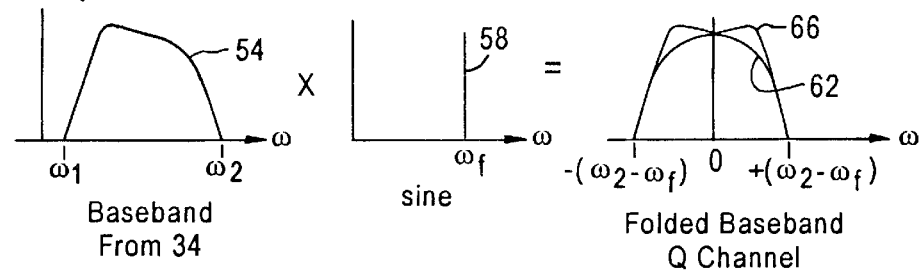
Figure 4C:
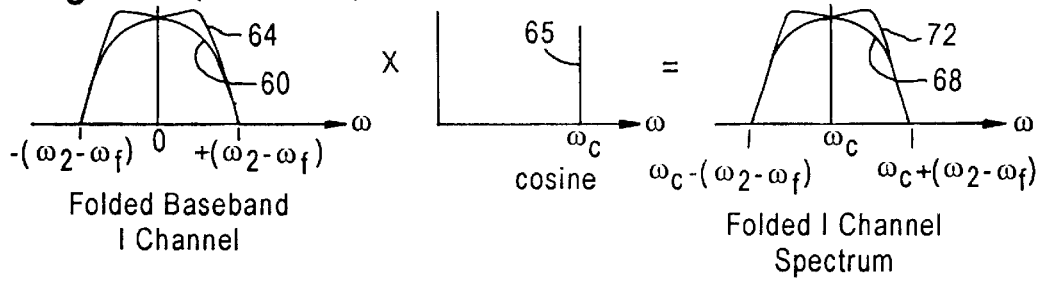
Figure 4D:
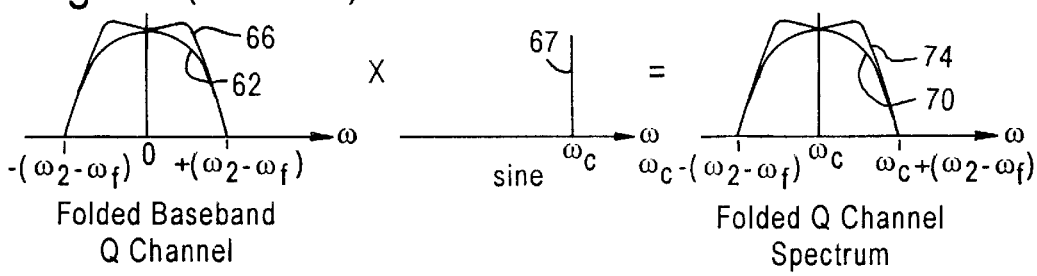
Figure 4E:
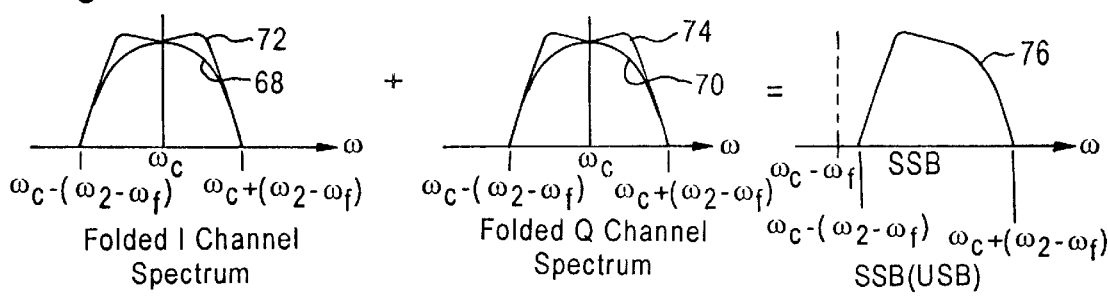

The values of the digital product signals derived by multipliers 208 and 210 are linearly combined in digital summer 214 which derives the digital vestigial sideband I.F. signal that is applied to digital to analog converter 30, FIG. 1. The analysis for the value of the output signal of the summer 214 is the same as the analysis previously described for the circuit of FIG. 7. The vestigial sideband modulator of FIG. 9 derives a digital signal having a sampling frequency at a round number, such that the I.F. derived by summer 214 is centered at 21.6 MHz.

Figure 10:
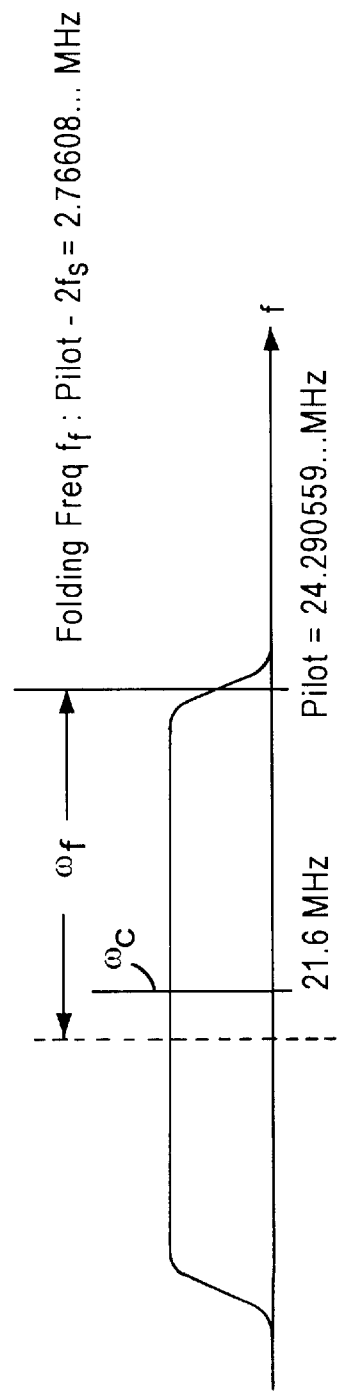
FIG. 10 is a spectral diagram helpful in describing the operation of the modulator illustrated in FIG.. 9.

FIG. 10 is an amplitude versus frequency response curve of the output of summer 214. The center of the spectrum illustrated in FIG. 10 is at 21.6 MHz, slightly displaced from the 21.524 . . . MHz output of interpolator 190, which is in turn two times the sampling frequency of the output of pilot inserter 24. Lowpass filter 192 shapes the low frequency skirt of the response of FIG. 10, i.e., the edge of the response to the left of the 21.6.MHz carrier frequency. Lowpass filters 200 and 202, in combination with the action of multipliers 194 and 196 and the combining action of summer 214, shape the upper frequency skirt of the response of FIG. 10, to the right side of 21.6 MHz.

The 24.290559 . . . MHz pilot frequency is in the upper frequency skirt at a frequency equal to the center I.F. of 21.6 MHz plus a frequency equal to one quarter of the sampling frequency applied to interpolator 190, i.e., 2.690555 . . . MHz. The folding frequency of synthesizer 198 equals the pilot frequency minus twice the sampling frequency, i.e., (24.290559 . . . MHz)−(21.52447552 . . . MHz)= (2.76608 . . . MHz). The 2.76608 . . . MHz folding frequency causes the response of FIG. 10 to be folded about 21.524 . . . MHz, i.e., at a frequency that is lower than the pilot frequency by twice the sampling frequency of the digital signal supplied to interpolator 190.

Figure 11:
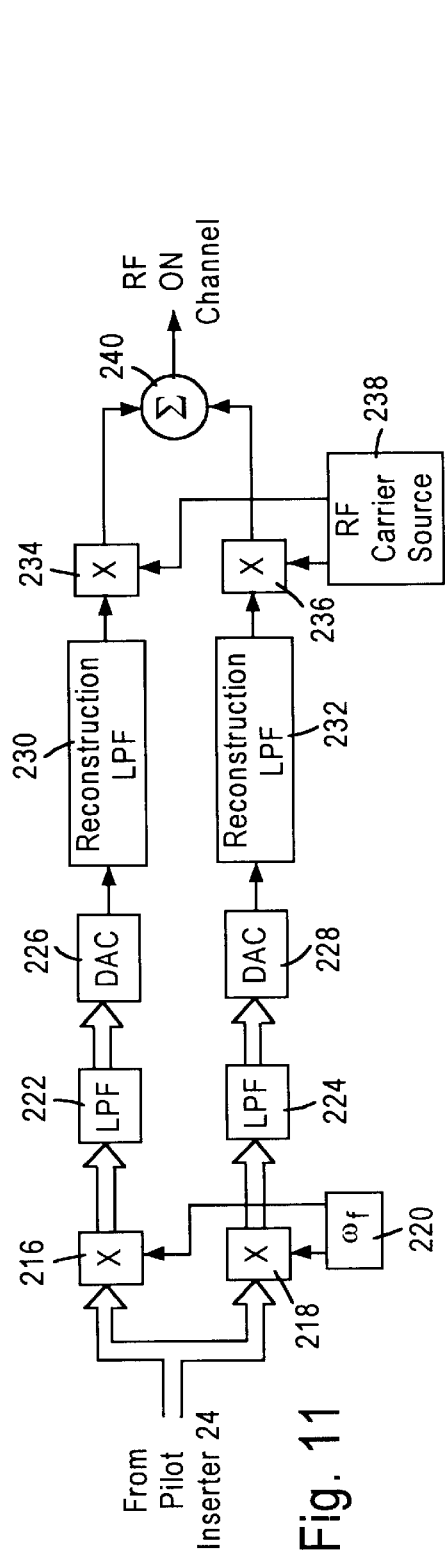
FIG. 11 is a block diagram of a further embodiment of the present invention wherein a vestigial sideband R.F.: signal is derived directly, without the intermediary of an I.F. conversion.

The invention is not limited to combining digital signals to derive a vestigial modulated signal. In accordance with another aspect of the invention, as illustrated in FIG. 11, digital components enabling the vestigial sideband transmitted signal to be derived are produced by converting the output signals of the modified Weaver lowpass filters to analog signals which are modulated on an analog I.F. or R.F. carrier. In the embodiment of FIG. 11, the output signal of pilot inserter 24 is applied in parallel to simple digital multipliers 216 and 218, also responsive to orthogonally phased digital sequences at the folding frequency, as derived by digital folding frequency generator 220. The resulting digital product signals derived by multipliers 216 and 218 are respectively supplied to digital lowpass filters 222 and 224. Simple digital multipliers 216, 218, generator 220 and digital lowpass filters 222 and 224 are constructed in the same manner as digital multipliers 140, 142, digital folding frequency generator 144 and digital lowpass filters 146 and 148, FIG. 7.

The digital output signals of lowpass filters 222 and 224 are respectively applied to matched digital to analog converters 226 and 228, which respectively drive reconstruction analog lowpass filters 230 and 232 that smooth the step transitions in the outputs of the digital to analog converters. The frequency of generator 220 and the pass and blocking frequencies of filters 222 and 224 are selected, as described supra in connection with FIGS. 5a–5h, to assure that the output signal of the circuit illustrated in FIG. 11 has a vestigial sideband.

The analog output signals of reconstruction lowpass filters 230 and 232 are respectively applied to balanced modulators, (i.e., mixers) 234 and 236, responsive to orthogonally phased analog sinusoidal waves derived by carrier source 238. Carrier source 238 can generate either an I.F. or R.F. frequency. The resulting analog product signals derived by balanced modulators 234 and 236 are added together in analog summer 240. If the frequency of carrier source 238 is an R.F., the output signal of summer 240 is applied directly to R.F. power amplifier 36 (FIG. 1). If, however, the frequency of carrier source 238 is an I.F., the analog output signal of summer 240 is applied to R.F. up converter 32, FIG. 1.

Figure 12:
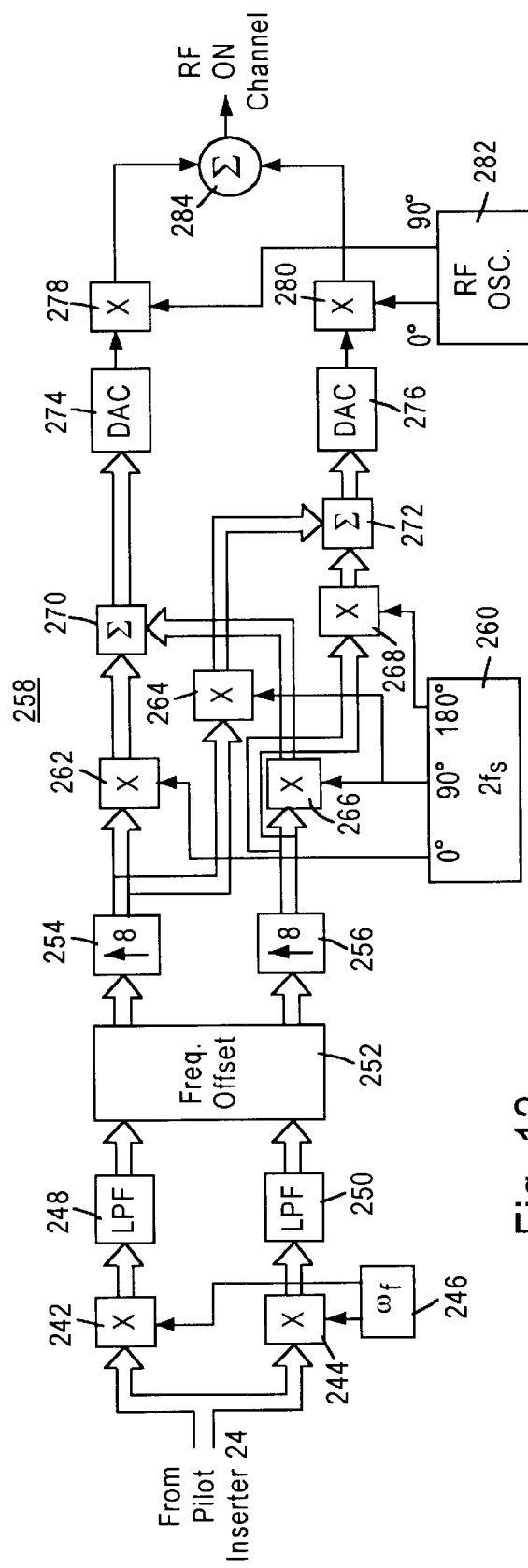
FIG. 12 is still another embodiment of a modified Weaver vestigial sideband orthogonal "imageless" modulator for deriving an ATSC/A53 signal.

According to a further embodiment of the invention, illustrated in FIG. 12, the Weaver vestigial sideband modulator of the invention is modified to be a quadrature "imageless" up conversion circuit. The output signal of pilot inserter 24 is initially processed in the circuit of FIG. 12 in the same manner as initial processing of the output of the pilot inserter in the embodiment of FIG. 8. To this end, the digital output signal of pilot inserter 24 is applied in parallel to simple digital multipliers 242 and 244, driven by orthogonal digital sequences derived by digital folding frequency generator 246. Multipliers 242, 244, digital folding frequency generator 246 and lowpass filters 248, 250 are respectively the same as digital multipliers 140, 142, digital folding frequency generator 144 and lowpass filters 146, 148, except for possible variations in the frequencies of the generator 246 and the passed and blocked frequencies of filters 248 and 250.

The resulting digital product signals derived by multipliers 242 and 244 are respectively applied to digital lowpass filters 248 and 250, having outputs that are supplied to digital frequency shifter 252. Frequency shifter 252 includes a digital offset frequency generator, four digital multipliers and two digital summers, respectively identical to digital offset frequency generator 170, digital multipliers 172–178 and summers 180, 182 (FIG. 8). Shifter 252 causes the I.F. of the signals derived by the circuit of FIG. 12 to have a "round number" such as 21.5 MHz. The orthogonally phased digital signals derived by shifter 252 are respectively applied to interpolators 254 and 256 which multiply the identical sampling frequencies of the two outputs of shifter 252 by a factor of eight. While shifter 252 is desirable, it is not necessary if there is no perceived need for the I.F. derived by the circuit of FIG. 12 to be a round number.

The orthogonally phased digital output signals of interpolators 254 and 256 are applied to digital combining network 258, also responsive to orthogonally phased digital sequences produced by digital I.F. generator 260. Digital I.F. generator 260 derives three digital sequences, one having a zero degree phase, one having a 90° phase and one having a 180° phase. The zero degree and 0° digital sequences derived by I.F. generator 260 are the same as the digital sequences derived by digital I.F. generator 166, except for differences in bit rate. The 180° sequence generator 260 derives is the exact complement of the zero degree sequence.

Combiner 258 includes digital multipliers 262, 264, 266 and 268, as well as digital summers 270 and 272. Each of multipliers 262–268 is of the simple type in that it passes, blocks or reverses the values of the digital signals supplied to it by one of interpolators 254 and 256. Interpolator 254 drives multipliers 262 and 264 in parallel, while interpolator 256 drives multipliers 266 and 2168 in parallel. Multipliers 264 and 266 are driven by the 0° sequence derived by digital I.F. generator 260, while multipliers 262 and 268 are respectively driven by the zero degree and 180° outputs of generator 260.

Digital summer 270 adds the output signals of digital multipliers 262 and 266, while digital summer 272 adds the digital product output signals of multipliers 264 and 268. Summers 270 and 272 derive digital signals which are quadrature phased with respect to each other and have a sampling frequency of approximately 20 MHz.

By proper selection of the frequencies of digital folding frequency generator 246 and the digital offset frequency generator in shifter 252 (corresponding to digital offset frequency generator 170 (FIG. 8)), the I.F. sampling frequency derived by summers 270 and 272 can be arranged to be a round number, such as 21.5 MHz.

The output signals of summers 270 and 272 can be digitally modulated in a digital modulator (not shown). The output of such a digital modulator has an output at the R.F. carrier frequency of the digital television transmitter of FIG. 1, at a desired round number, and contains only one full sideband, i.e., is imageless, and the vestigial sideband. In such a situation, the output of the modulator is applied to digital to analog converter 30 (FIG. 1), which must operate at the transmitter carrier frequency.

Alternatively and at the present time more practically, the output signals of digital summers 270 and 272 are respectively applied to matched digital to analog converters 274 and 276. Converters 274 and 276 derive quadrature phased I.F. signals respectively applied to analog balanced modulators 278 and 280. Balanced modulators 278 and 280 are also responsive to quadrature phased sinusoidal analog output signals of R.F. oscillator 282, having a frequency centered within the channel frequency of the television transmitter. The quadrature phased R.F. outputs of multipliers 278 and 280 are added in analog summer 284 which derives the vestigial sideband signal applied to R.F. power amplifier 36 (FIG. 1).

The modified Weaver modulation technique and apparatus of the present invention can also be used to generate an NTSC signal that has been converted from analog form to SMPTE digital format, as is frequently the case in modern television plants. By using the modified Weaver modulator to produce both NTSC and ATSC signals, the differences between the NTSC and ATSC signal paths are minimized to maximize reuse of the same components in both modulators. However, use of the modified Weaver technique to generate the NTSC signal does not provide significant cost savings relative to conventional Hilbert transform techniques. This is in contrast to the cost savings the Weaver technique attains to generate the ATSC signals relative to the conventional filter or Hilbert transform methods. The computation rate is approximately the same for a Hilbert transform NTSC modulator as for a modified Weaver NTSC modulator using the principles of the invention.

Figure 13:
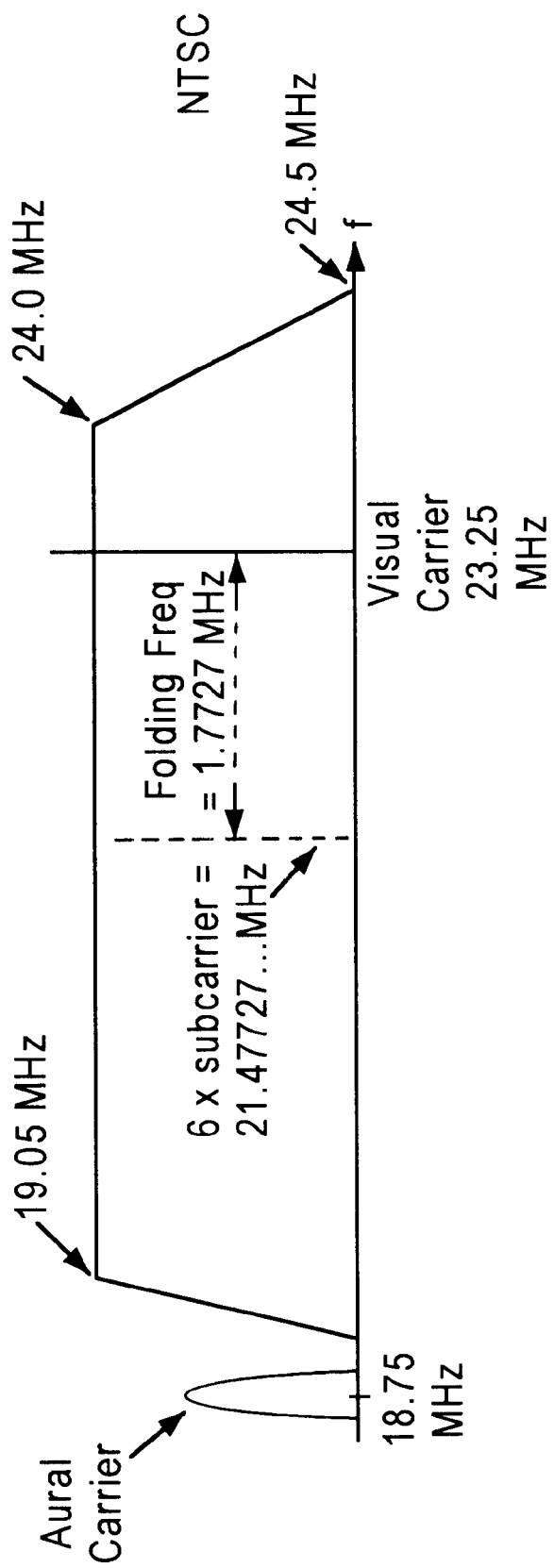
FIG. 13 is a spectrum diagram of an NTSC digital I.F. signal derived in a transmitter including a modified Weaver modulator in accordance with the invention.

There are several differences between the modified Weaver modulators for ATSC and NTSC. In ATSC the spectrum is symmetrical, so that the Weaver folding frequency is near the center of the spectrum as illustrated in FIGS. 5a and 5b where $\omega_4$ is equal to $0.5\omega_m$. For NTSC the shapes of the vestigial lower sideband and the upper sideband differ and the spectrum is asymmetrical, as illustrated in FIG. 13, a spectrum diagram of an inverted NTSC signal conforming to FCC specifications. The spectrum illustrated in FIG. 13 includes a visual carrier at 23.25 MHz for the visual portion of the spectrum, which is flat between 19.05 MHz and 24.0 MHz, has a high frequency tail extending from 24.0 MHz to 24.5 MHz and a steep low frequency tail between about 18.85 MHz and 19.05 MHz. The spectrum of FIG. 13 also includes a frequency modulated aural carrier at 18.75 MHz for the frequency modulated audio information that occupies a bandwidth of approximately 200 kHz.

The NTSC modified Weaver modulator operates at sampling rates of $4F_{sc}$, $8F_{sc}$ and 24F., ($F_{sc}$=subcarrier frequency.) The ATSC and NTSC modified Weaver modulators produce signals centered at 21.5 MHz, occupying a spectrum from 18.5 MHz to 24.5 MHz. The ATSC and NTSC spectra derived by the modified Weaver modulators are inverted relative to the spectra derived by a power amplifier, (e.g., amplifier 36) because of the frequency inversion performed by an up frequency converter (e.g., converter 32) responsive to the modulator output signal converter. The modified Weaver NTSC modulator has a folding frequency of 1.77272727 . . . MHz to provide a digital I.F. of 21.4772727 . . . MHz while still centering the output at 21.5 MHz. The 21.477272727 . . . MHz I.F. is six times the 3.57954545 . . . MHz subcarrier frequency of the SMPTE signal supplied to the modified Weaver NTSC modulator.

Figure 14:
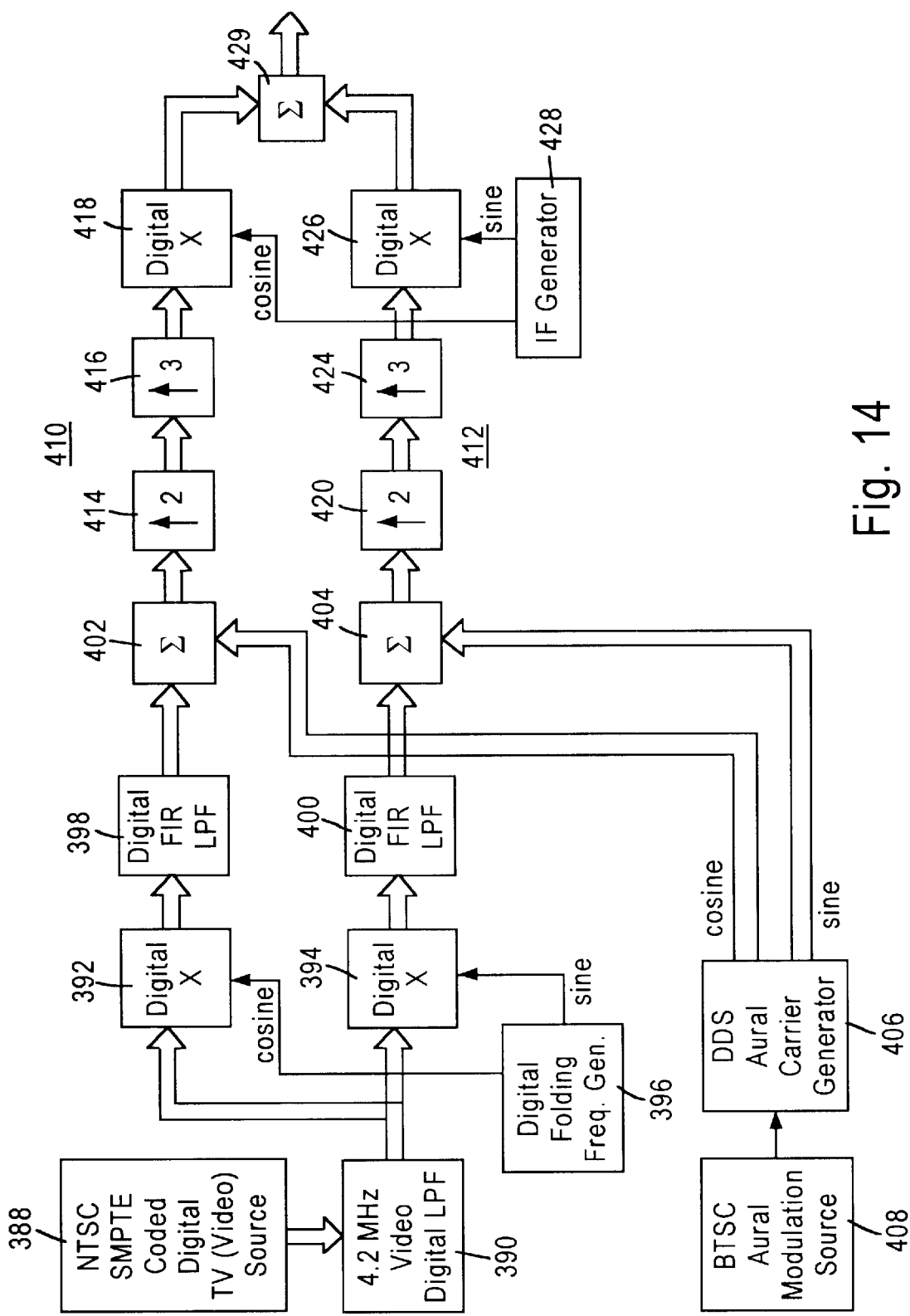
FIG. 14 is a modified Weaver modulator in accordance with another embodiment of the invention for deriving the spectrum of FIG. 13.

FIG. 14, a block diagram of a Weaver modulator modified to provide the NTSC spectrum of FIG. 13., includes digital video source 388 for deriving a multi-bit parallel NTSC video signal, from SMPTE 259 format, having a 3.579545454 . . . MHz subcarrier frequency. Source 388 supplies the NTSC coded signal to sharp cutoff 4.2 MHz video digital lowpass filter 390 for deriving a multi-bit parallel output signal. The output signal of filter 390 is supplied in parallel to general purpose multipliers 392 and 394, respectively responsive to digital signals representing orthogonally phased cosine and sine folding waves derived by direct digital synthesizer 396. Multipliers 392 and 394 derive digital product signals that are respectively applied to digital lowpass filters 398 and 400, each having a substantially flat response from DC to 2.52272727 . . . MHz and severe attenuation at 3.02272727 . . . MHz. The NTSC modified Weaver modulator does not require a frequency offsetter corresponding to frequency offset generator 170 in FIG. 8, because frequency offsets can be produced simply by adjusting the folding frequency and the aural carrier generator frequency.

Filters 398 and 400 respectively supply digital output signals to digital adders 402 and 404, also responsive to orthogonally phased digital signals derived by direct digital synthesizer 406 that generates a carrier frequency of 2.7272727 . . . MHz. Aural digital source 408 is coupled to synthesizer 406 to cause the synthesizer to derive a digital signal having variations in accordance with the FM spectrum of the aural information of source 408.

Interpolator sets 410 and 412 multiply the sampling rates of the digital signals derived by adders 402 and 404 by a factor of six. Interpolator set 410 includes cascaded upsample-by-2 and upsample-by-3 sampling rate interpolators 414 and 416 which respectively multiply the sampling rates of the signals applied to them by factors of 2 and 3, so interpolator 416 supplies a signal to digital multiplier 418 that has a sampling frequency six times the sampling frequency of the output of adder 402. The Weaver modulation provided by the circuitry including multipliers 392 and 394 operates at a sampling rate of four times the subcarrier frequency so that the signal supplied to multiplier 418 has a sampling frequency 24 times the subcarrier frequency, i.e., 85.909090909 . . . MHz, which is very close to the ATSC output clock rate of 86.0979021 . . . MHz. Interpolator set 412 includes cascaded upsample by 2 and upsample by 3 interpolators 420 and 424, such that digital multiplier 426, responsive to interpolator 424, is also supplied with a signal having a sampling rate that is 24 times the sampling rate of the subcarrier of the signal derived by source 388.

Multipliers 418 and 426 are driven by orthogonal digital sequences respectively representing the cosine and sine of the I.F. as derived from I.F. generator 428. The digital output signals of multipliers 418 and 426 are linearly combined in adder 429, which derives a digital vestigial I.F. signal that is supplied to a digital to analog converter similar to digital to analog converter 30.

I.F. generator 428 derives sequences representing orthogonal cosine and sine waves in a similar manner to the sequences derived by I.F. generator 166. Adders 402 and 404 are basically the same as adders 180 and 182, except that adder 182 is configured as a subtracter. Multipliers 418 and 426 are configured the same as multipliers 162 and 164 and I.F. generator 428 is the same as I.F. generator 366. Adders 429 and 168 have the same configuration.

The modulator of FIG. 14 folds the high amplitude part of the upper sideband of the spectrum illustrated in FIG. 13 to the corner frequency of the sideband (24.0 MHz) minus the carrier frequency (21.4777272727 . . . MHz). Hence, the high amplitude part of the upper sideband of the spectrum illustrated in FIG. 13 folds to 2.5227272727 . . . MHz. The lowest amplitude part of the upper sideband of the spectrum illustrated in FIG. 13 at 24.5 MHz folds to 24.5 MHz– 21.47772727 . . . MHz=3.02272727 . . . MHz. To pass the high amplitude portion and reject the lower amplitude portion of the upper sideband of the FIG. 13 spectrum, lowpass filters 398 and 400 in FIG. 14 are flat to 2.5227272727 . . . MHz and substantially block frequencies at and greater than 3.02272727 . . . MHz. The modified Weaver modulation processing by multipliers 392, 394 and lowpass filters 398, 400 folds the sidebands of the 4.2 MHz video frequencies passed by filter 390 to 2.4772727 . . . MHz, which is translated to the 19.05 MHz corner of the lower sideband vestigial sideband spectrum illustrated in FIG. 13.

If the aural carrier frequency of 4.5 MHz in the spectrum of FIG. 13 were coupled from filter 390 to multipliers 392 and 394 of FIG. 14, the aural carrier frequency would fold to 21.4777272727 . . . MHz, (i.e., the I.F.)–18.75 MHz (i.e., the aural carrier frequency)=2.727272727 . . . MHz. The 2.727272727.MHz frequency would be in the frequency transition band of lowpass filters 398 and 400, i.e., between 2.5227272727 . . . MHz and 3.02272727 . . . MHz. Thus, the aural information would be substantially attenuated by lowpass filters 398 and 400.

The highest frequencies processed by multipliers 392 and 394 and lowpass filters 398 and 400 correspond to the frequencies of the vestigial upper sideband of the spectrum illustrated in FIG. 13. Hence, lowpass filters 398 and 400 only determine the shape of the vestigial sideband and do not affect the roll-off shape of the lower sideband of the spectrum illustrated in FIG. 13. Consequently, the lower sideband of the spectrum illustrated in FIG. 13 is shaped independently by simple video lowpass filter 390 prior to the Weaver modulation process performed by multipliers 392 and 394 and lowpass filters 398 and 400. The 4.5 MHz aural carrier cannot be added to the video signal derived from source 388 prior to the Weaver modulation processing by multipliers 392 and 394 and lowpass filters 398 and 400 using these frequencies and sampling rates. If the aural carrier were added to the video prior to the Weaver modulation, the aural carrier would be severely attenuated because it would fall within the frequency transition range of lowpass filters 398 and 400.

Because the aural carrier of source 408 is not added directly to the output of video source 388, but is injected into the circuitry after the Weaver modulation processing performed by multipliers 392 and 394 and lowpass filters 398 and 400, the lowpass filter cut-off characteristics do not affect the aural signal. Even if it were possible to add the aural carrier of source 408 directly to the video of source 388, the aural signal is preferably introduced into the modulation circuit downstream of filters 398 and 400 to enable the filters to have a wider dynamic range and lower quantizing noise.

While there have been described and illustrated specific embodiments of the invention, it will be clear that variations in the details of the embodiments specifically illustrated and described may be made without departing from the true spirit and scope of the invention as defined in the appended claims.

I claim:

1. A method of converting a first signal having a frequency $\omega_m$ in a predetermined bandwidth extending from $\omega_1$ to $\omega_2$ to a vestigial sideband signal containing information contained in the first signal, the method comprising:

multiplying the first signal by orthogonally phased sinusoidal components having a frequency $\omega_4$ to derive orthogonal second and third signals, each of the second and third signals having a frequency equal to $(\omega_m-\omega_4)$ and containing the information in the first signal, wherein $\omega_4$ is a folding frequency greater than zero and less than or equal to $(\omega_1+\omega_2)/2$;

lowpass filtering the second and third signals to derive orthogonal fourth and fifth signals having the same frequencies and containing the information in the first signal, wherein the fourth and fifth signals have a spectrum extending between $\omega_1$ and $\omega_3$, where $\omega_3$ is between $\omega_4$ and $\omega_m$, the fourth and fifth signals being such that the frequency components of the first signal extending between $\omega_4$ and $\omega_2$ are folded on the frequency components of the first signal extending between $\omega_1$ and $\omega_4$;

multiplying the fourth or fifth signals with quadrature phases of a carrier to produce a plurality of product signals, wherein the plurality of product signals replicate the information in the fourth and fifth signals and the carrier; and linearly combining the plurality of product signals to derive the vestigial sideband signal containing the information in the first signal.

2. The method of claim 1 wherein the first signal is a baseband signal such that $\omega_1=0.\omega_4$ is a folding frequency no greater than $$\frac{\omega_2}{2},$$

the low pass filtering step passing without substantial attenuation signals having frequencies from DC to $\omega_5$ and substantially blocking frequencies greater $\omega_6$, where $\omega_5$ is $$> \frac{\omega_2}{2}$$

and $\omega_6$ is $<\omega_2$, the combining step being such that negative frequencies of the first signal appear in the vestigial sideband signal as a vestige of the sideband of the vestigial sideband signal containing the positive frequencies of the first signal.

3. The method of claim 1 wherein the first, second, third, fourth and fifth signals are digital signals having a first fixed sampling frequency, the method further comprising:

increasing the first fixed sampling frequency of the fourth and fifth signals to a second fixed sampling frequency; and multiplying signals having the second fixed sampling frequency with orthogonal phases of the carrier to derive the plurality of product signals.

4. The method of claim 3 wherein the carrier is a digital I.F., and the plurality of product signals are digital signals that are linearly combined to derive a digital vestigial I.F.

5. The method of claim 4 further including offsetting the sampling frequency of the fourth and fifth digital signals.

6. The method of claim 4 wherein the first signal has a sampling frequency that is a fraction of a fixed sampling frequency of an input signal containing the information in the first signal, further including increasing the sampling frequency of the input signal to derive the first signal, low pass filtering the first signal, the low pass filtered first signal being multiplied by the components having the frequency $\omega_4$.

7. The method of claim 3 further including converting signals that replicate the information in the fourth and fifth signals into first and second analog signals, mixing the first and second analog signals with orthogonal components of the carrier to derive a pair of orthogonal analog product signals, and linearly combining the pair of orthogonal analog product signals to derive the vestigial sideband signal.

8. The method of claim 7 wherein the carrier is at R.F. so the vestigial sideband signal is modulated on the carrier, and further including amplifying the carrier modulated by the vestigial sideband signal.

9. The method of claim 8 further including offsetting the sampling frequency of the fourth and fifth digital signals.

10. The method of claim 1 wherein the first, second, third, fourth and fifth signals are digital signals having a first fixed sampling frequency, converting signals that replicate the information in the fourth and fifth signals into first and second analog signals with orthogonal components of the carrier to derive a pair of orthogonal analog product signals, and linearly combining the pair of orthogonal analog product signals to derive the vestigial sideband signal.

11. The method of claim 10 wherein the converting step is performed on the fourth and fifth signals so the first and second analog signals are at baseband.

12. The method of claim 11 wherein the carrier is at R.F. so the vestigial sideband signal is modulated on the carrier, and further including amplifying the carrier modulated by the vestigial sideband signal.

13. The method of claim 10 further including increasing the sampling frequency of the fourth and fifth signals to derive sixth and seventh digital signals, combining the sixth and seventh digital signals with orthogonal components of a digital I.F. carrier to derive eighth and ninth orthogonal phased digital signals at the I.F. carrier, converting the eighth and ninth orthogonal phased digital signals at the I.F. carrier into the first and second analog signals, mixing the first and second analog signals with orthogonal components of an analog carrier to derive a pair of orthogonal analog product signals, and linearly combining the pair of orthogonal analog product signals to derive the vestigial sideband signal.

14. The method of claim 1 further including upwardly shifting the frequency domain of the orthogonally phased sinusoidal components including components of the fourth and fifth signals by the same factor (N) without changing the information in the first signal to derive sixth and seventh orthogonally phased signals containing replicas of the fourth and fifth signals, and multiplying the sixth and seventh signals by orthogonally phased sinusoidal components having a frequency $\omega_5$ to derive the vestigial sideband signal.

15. The method of claim 14 further including causing the frequency of the vestigial sideband signal to be offset from $\omega_5$ by $\omega_6$.

16. The method of claim 15 wherein the frequency of the vestigial sideband signal is offset from $\omega_5$ by $\omega_6$ by multiplying the fourth and fifth signals by orthogonally phased first and second sinusoidal components having the frequency $\omega_6$ to derive eighth, ninth, tenth and eleventh signals, respectively indicative of the products of the fourth signal and the first component at frequency $\omega_6$, the fifth signal and the second component at frequency $\omega_6$, the fourth signal and the second component at frequency $\omega_6$ and the fifth signal and first component at frequency $\omega_6$; linearly combining the eighth and ninth signals to derive a twelfth signal, linearly combining the tenth and eleventh signals to derive a thirteenth signal, the twelfth and thirteenth signals being orthogonally phased and having the same frequency which is offset from $(\omega_m-\omega_4)$ by $\omega_6$, and performing the step of shifting the frequency domain on the twelfth and thirteenth signals.

17. The method of claim 15 wherein the frequency of the vestigial sideband signal is offset from $\omega_5$ by $\omega_6$ by combining the fourth and fifth signals with orthogonally phased first and second sinusoidal components having the frequency $\omega_6$ to derive twelfth and thirteenth orthogonally phased signals having the same frequency which is offset from $(\omega_m-\omega_4)$ by $\omega_6$, and performing the step of shifting the frequency domain on the twelfth and thirteenth signals.

18. The method of claim 17 wherein the first signal is a digital television signal.

19. The method of claim 18 wherein the vestigial sideband signal is a digital signal and further including converting the digital vestigial, sideband signal to an analog signal.

20. The method of claim 19 wherein the analog signal is an I.F., and further including up frequency converting the I.F. to derive an output signal having a spectrum inverted relative to the I.F. signal.

21. The method of claim 20 wherein the first signal is an ATSC/A53 signal.

22. The method of claim 20 wherein the I.F. is centered at approximately 21.5 MHz.

23. The method of claim 22 wherein the offset frequency is approximately 24.47 KHz.

24. The method of claim 19 wherein the first signal is an NTSC signal coded in accordance with SMPTE 244M.

25. The method of claim 24 wherein the orthogonally phased sinusoidal components are digital signals having values resulting from frequency modulating an aural television signal on a predetermined frequency, linearly combining the orthogonally phased components that are digital signals having values resulting from frequency modulating an aural television signal on a predetermined frequency with the fourth and fifth signals to derive the fourteenth and fifteenth signals.

26. The method of claim 1 wherein the first signal is a digital signal and each cycle of the orthogonally phased sinusoidal components is represented by four digital values the multiplying step being performed such that a first of the digital values passes bits of the first signal in unaltered form and a second of the digital values inverts the polarity of the first signal.

27. The method of claim 1 wherein the first signal is a digital signal and each cycle of the orthogonally phased sinusoidal components is represented by four digital values, the multiplying step being performed such that a first of the digital values passes bits of the first signal in unaltered form, a second of the digital values inverts the polarity of the first signal, and a third of the digital values blocks bits of the first signal.

28. A vestigial sideband modulator responsive to a first signal comprising information and having a frequency $\omega_m$ in a predetermined bandwidth extending from $\omega_1$ to $\omega_2$, the modulator comprising:

a source of orthogonally phased sinusoidal components having a folding frequency $\omega_4$, where $\omega_4$ is folding frequency equal to or less than $(\omega_1"\omega_2)/2$;

a first signal multiplying arrangement adapted to be responsive to the first signal and the orthogonally phased sinusoidal components, the first signal multiplying arrangement generating orthogonally phased second and third signals containing the information of the first signal, each of the second and third signals having a frequency equal to $(\omega_m-\omega_4)$;

a lowpass filter arrangement adapted to be responsive to the second and third signals for deriving orthogonal fourth and fifth signals that contain the information of the first signal and have the same frequency, the fourth and fifth signals having a spectrum extending between $\omega_1$ and $\omega_3$, where $\omega_3$ is between $\omega_1$ and $\omega_4$, the fourth and fifth signals being such that the frequency components of the first signal extending between $\omega_4$ and $\omega_2$ are folded on the frequency components of the first signal extending between $\omega_1$ and $\omega_4$;

a second signal multiplying arrangement adapted to be responsive to the fourth and fifth signals and quadrature phases of a carrier to generate a plurality of product signals; and a signal combiner adapted to linearly combine the plurality of product signals to derive a vestigial sideband signal containing the information in the first signal.

29. The modulator of claim 28 wherein $\omega_4$ is a folding frequency no greater than $$\frac{\omega_2}{2},$$

the first signal is a baseband signal such that $\omega_1=0$, the low pass filter arrangement being arranged to pass without substantial attenuation signals having frequencies from DC to $\omega_5$ and to substantially block frequencies greater than $\omega_6$, where $\omega_5$ is $$> \frac{\omega_2}{2}$$

and $\omega_6$ is $<\omega_2$, the signal combiner being such that negative frequencies of the first signal appear in the vestigial sideband signal as a vestige of the sideband of the vestigial sideband signal containing the positive frequencies of the first signal.

30. The modulator of claim 28 wherein the first, second, third, fourth and fifth signals are digital signals having a first fixed sampling frequency, and further including:
   circuitry for increasing the first fixed sampling frequency of the fourth and fifth signals to a second fixed sampling frequency; and
   a mixer for mixing signals having the second fixed sampling frequency with orthogonal phases of the carrier to derive the plurality of product signals.

31. The modulator of claim 30 wherein the carrier is a digital I.F., the plurality of product signals are a plurality of digital product signals, and the signal combiner linearly combines the plurality of digital product signals to derive a digital vestigial I.F.

32. The modulator of claim 31 further including a frequency offsetter for offsetting the sampling frequency of the fourth and fifth digital signals.

33. The modulator of claim 31 wherein the first signal has a sampling frequency that is a fraction of a fixed sampling frequency of an input signal containing the information in the first signal, further including digital processing circuitry for (a) increasing the sampling frequency of the input signal to derive the first signal, (b) low pass filtering the first signal, the low pass filtered first signal being multiplied in the digital processing circuitry by the components having the frequency $\omega_4$.

34. The modulator of claim 30 further including an analog to digital converter arrangement responsive to the fourth and fifth signals for converting signals that replicate the information in the fourth and fifth signals into first and second analog signals, and circuitry for mixing the first and second analog signals with orthogonal components of the carrier to derive a pair of orthogonal analog product signals and for linearly combining the pair of orthogonal analog product signals to derive the vestigial sideband signal.

35. The modulator of claim 34 wherein the carrier is at R.F. so the vestigial sideband signal is modulated on the carrier, and further including an amplifier for amplifying the carrier modulated by the vestigial sideband signal.

36. The modulator of claim 35 and further including digital circuitry for offsetting the sampling frequency of the fourth and fifth digital signals.

37. The modulator of claim 28 wherein the first, second, third, fourth and fifth signals are digital signals having a first fixed sampling frequency, circuitry adapted to be responsive to the fourth and fifth signals for converting signals that replicate the information in the fourth and fifth signals into first and second analog signals, and analog processing circuitry for (a) mixing the first and second analog signals with orthogonal components of the carrier to derive a pair of orthogonal analog product signals and (b) for linearly combining the pair of orthogonal analog product signals to derive the vestigial sideband signal.

38. The modulator of claim 37 wherein the carrier is at R.F. so the vestigial sideband signal modulates the carrier, and an amplifier for amplifying the carrier modulated by the vestigial sideband signal.

39. The modulator of claim 37 wherein the carrier is a digital I.F. carrier and further including digital processing circuitry for (a) increasing the sampling frequency of the fourth and fifth signals to derive sixth and seventh digital signals and (b) combining the sixth and seventh digital signals with orthogonal components of the digital I.F. carrier to derive eighth and ninth orthogonal phased digital signals at the I.F. carrier, digital to analog converter circuitry for converting the eighth and ninth orthogonal phased digital signals at the I.F. carrier into the first and second analog signals, and analog processing circuitry for (a) mixing the first and second analog signals with orthogonal components of the carrier to derive a pair of orthogonal analog product signals, and (b) linearly combining the pair of orthogonal analog product signals to derive the vestigial sideband signal.

40. The modulator of claim 28 further including a frequency upshifting arrangement adapted to be response to the orthogonally phased sinusoidal components including components of the fourth and fifth signals for upshifting the frequency of the orthogonally phased sinusoidal components including components of the fourth and fifth signals by the same factor (N) to derive sixth and seventh orthogonally phased signals containing replicas of the fourth and fifth signals, a source of orthogonally phased sinusoidal components having a frequency $\omega_5$, and a multiplying arrangement adapted to be responsive to the sixth and seventh orthogonally phased signals for multiplying the sixth and seventh orthogonally phased signals by orthogonally phased sinusoidal components having a frequency $\omega_5$ to derive the vestigial sideband signal.

41. The modulator of claim 28 further including a source having an offset frequency $\omega_6$, the source having an offset frequency $\omega_6$ being coupled with a circuit arrangement for offsetting the frequency of the vestigial sideband signal from $\omega_5$ by $\omega_6$.

42. The modulator of claim 41 wherein the source of offset frequency derives orthogonally phased first and second sinusoidal components having the frequency of $\omega_6$, the circuit arrangement for offsetting the frequency of the vestigial sideband signal from $\omega_5$ by $\omega_6$ including a signal multiplying arrangement adapted to be responsive to the fourth and fifth signals and the orthogonally phased first and second sinusoidal components having the frequency $\omega_6$ for deriving eighth, ninth, tenth and eleventh signals, respectively indicative of the products of the fourth signal and the first component at frequency $\omega_6$, the fifth signal and the second component at frequency $\omega_6$, the fourth signal and the second component at frequency $\omega_6$ and the fifth signal and the first component at frequency $\omega_6$; and a signal combining arrangement adapted to be responsive to the eighth, ninth, tenth and eleventh signals for (a) linearly combining the eighth and ninth signals to derive a twelfth signal, and (b) linearly combining the tenth and eleventh signals to derive a thirteenth signal, the twelfth and thirteenth signals being orthogonally phased and having the same frequency which is offset from $(\omega_m-\omega_4)$ by $\omega_6$, the frequency upshifting arrangement being adapted to be responsive to the twelfth and thirteenth signals.

43. The modulator of claim 41 wherein the source of offset frequency derives orthogonally phased first and second sinusoidal components having the frequency $\omega_6$, the circuit arrangement for offsetting the frequency of the vestigial sideband signal from $\omega_5$ by $\omega_6$ including a signal combining arrangement adapted to be responsive to the fourth and fifth signals and the orthogonally phased first and second sinusoidal components having the frequency $\omega_6$ for deriving twelfth and thirteenth orthogonally phased signals having the same frequency which is offset from $(\omega_m-\omega_4)$ by $\omega_6$, the frequency upshifting arrangement being adapted to be responsive to the twelfth and thirteenth signals.

44. The modulator of claim 28 wherein the first signal is a digital television signal and the vestigial sideband signal is derived from a pair of digital signals having orthogonally phased information.

45. A digital television transmitter including the modulator of claim 44 and further including a digital to analog converter arrangement for converting a pair of digital signals containing the vestigial sideband information into an analog signal modulating a carrier.

46. The television transmitter of claim 45 wherein the analog signal is modulating an I.F. carrier, further including an up converter for increasing the I.F. carrier frequency to derive an output signal having a spectrum inverted relative to the I.F. signal.

47. A digital television transmitter including the modulator of claim 28, wherein the first signal is an ATSC/A53 signal and the orthogonally phased components are digital sequences representing sinusoidal waves at frequency $\omega_4$, wherein the signal combiner includes a digital to analog converter arrangement and a signal adder arrangement for deriving an analog signal vestigial sideband signal including the information in the ATSC/A53 signal modulated on an R.F. carrier.

48. A digital television transmitter including the modulator of claim 28, wherein the first signal is an NTSC signal having an SMPTE 244M code and the orthogonally phased components are digital sequences representing sinusoidal waves at frequency $\omega_4$, and the signal combiner includes a digital to analog converter arrangement and a signal adder arrangement for deriving an analog signal modulating an R.F. carrier, the analog signal being a vestigial sideband signal including the information in the NTSC signal coded in accordance with SMPTE 244M signal.

49. The digital television transmitter of claim 48 wherein the orthogonally phased components are digital signals having values resulting from frequency modulating an aural television signal on a predetermined frequency, the signal combiner being arranged for combining the fourth and fifth signals with orthogonally phased components that are digital signals having values resulting from frequency modulating the aural television signal on the predetermined frequency.

50. A digital television transmitter responsive to a digital television signal comprising a digital vestigial sideband modulator including,
  a digital sinusoidal source for deriving at least two digital signals representing sinusoidal waves,
  a digital multiplier arrangement having at least two multipliers, each multiplier for multiplying a digital signal including information in the digital television signal by an associated digital sequence derived by the digital sinusoidal source and for deriving plural digital product signals,
  a digital lowpass filter arrangement for passing low frequency components of the plural digital product signals and blocking high frequency components of the plural digital product signals,
  circuitry adapted to be responsive to a carrier and the signals passed by the lowpass filter arrangement for deriving an analog vestigial sideband signal including the information in the digital television signal, the analog vestigial sideband signal modulating the carrier, and
  further including another digital sinusoidal source for deriving other digital signals presenting sinusoidal waves having an offset frequency, a first digital signal combiner for combining the another digital signals and the digital components passed by the low pass filter arrangement, whereby the frequency of a digital I.F. is changed by a frequency determined by the offset frequency.

51. The digital television transmitter of claim 50 wherein the carder is at I.F. and further including an up converter for increasing the frequency of the I.F. carrier to an R.F. carrier.

52. The digital television transmitter of claim 50 wherein the digital signals represent sinusoidal waves having a predetermined frequency, some of the passed low frequency components having a frequency greater than the predetermined frequency and some of the blocked high frequency components having a frequency less than the highest frequency of the information in the digital signal applied to the multiplier arrangement.

53. The digital television transmitter of claim 50 wherein the circuitry includes: (a) a second digital signal combiner responsive to signals derived by the digital lowpass filter arrangement for deriving at least one digital signal including information in the vestigial sideband signal and (b) a digital to analog converter arrangement for converting the at least one digital signal including information in vestigial sideband signal into the analog vestigial sideband signal.

54. The digital television transmitter of claim 53 wherein the second digital signal combiner derives a digital vestigial sideband signal at an I.F. sampling frequency, the digital to analog converter arrangement being arranged for converting the digital vestigial sideband signal at the I.F. sampling frequency into the analog vestigial sideband signal.

55. The digital television transmitter of claim 50 wherein the digital television signal is coded ATSC and the offset frequency causes the digital I.F. to have a frequency with a particular desired value, the first digital signal combiner being arranged to combine the another digital signal and the digital components passed by the lowpass filter arrangement to derive the digital I.F. having a frequency with the particular desired value.

56. The digital television transmitter of claim 50 wherein the digital television signal is coded NTSC and said another digital sinusoidal source derives said another digital signal at a frequency causing the digital I.F. to include an aural carrier with frequency modulated aural information, the first digital signal combiner being arranged for combining said another digital signal and the digital components passed by the lowpass filter arrangement and for deriving a digital signal having an aural carrier with frequency modulated aural information.

57. The digital television transmitter of claim 54 further including an up frequency shifter arrangement for increasing the sampling rate of the digital signals applied to the second digital signal combiner by a predetermined factor.

58. A digital television transmitter responsive to a digital television signal comprising a digital vestigial sideband modulator including;
  a digital sinusoidal source for deriving at least two digital signals representing sinusoidal waves;
  a digital multiplier arrangement having at least two multipliers, each multiplier for multiplying a digital signal including information in the digital television signal by an associated digital sequence derived by the digital sinusoidal source and for deriving plural digital product signals;
  a digital lowpass filter arrangement for passing low frequency components of the plural digital product signals and blocking high frequency components of the plural digital product signals;
  circuitry adapted to be responsive to a carrier and the signals passed by the lowpass filter arrangement for deriving an analog vestigial sideband signal including the information in the digital television signal, the analog vestigial sideband signal modulating the carrier; and
  further including an up frequency shifter arrangement for increasing by a predetermined factor a sampling rate of the digital signals applied to a first digital signal combiner.

59. The digital television transmitter of claim 58 wherein the carrier is at I.F. and further including an up converter for increasing the frequency of the I.F. carrier to an R.F. carrier.

60. The digital television transmitter of claim 58 wherein the digital signals represent sinusoidal waves having a predetermined frequency, some of the passed low frequency components having a frequency greater than the predetermined frequency and some of the blocked high frequency components having a frequency less than the highest frequency of the information in the digital signal applied to the multiplier arrangement.

61. The digital television transmitter of claim 58 wherein the circuitry includes: (a) the first digital signal combiner responsive to signals derived by the digital lowpass filter arrangement for deriving at least one digital signal including information in the vestigial sideband signal and (b) a digital to analog converter arrangement for converting the at least one digital signal including information in vestigial sideband signal into the analog vestigial sideband signal.

62. The digital television transmitter of claim 61 wherein the digital signal combiner derives a digital vestigial sideband signal at an I.F. sampling frequency, the digital to analog converter arrangement being arranged for converting the digital vestigial sideband signal at the I.F. sampling frequency into the analog vestigial sideband signal.

63. The digital television transmitter of claim 62 further including an up frequency shifter arrangement for increasing the sampling rate of the digital signals applied to the first digital signal combiner by a predetermined factor.

* * * * *

UNITED STATES PATENT AND TRADEMARK OFFICE
CERTIFICATE OF CORRECTION

| | | |
|---|---|---|
| PATENT NO. | : 6,724,832 B1 | Page 1 of 1 |
| APPLICATION NO. | : 09/239668 | |
| DATED | : April 20, 2004 | |
| INVENTOR(S) | : Hershberger | |

It is certified that error appears in the above-identified patent and that said Letters Patent is hereby corrected as shown below:

At Claim 37, Column 25, Line 44, please replace "arc" with --are--

At Claim 51, Column 27, Line 66, please replace "carder" with --carrier--

Signed and Sealed this

Twenty-seventh Day of November, 2007

JON W. DUDAS
*Director of the United States Patent and Trademark Office*